(12) United States Patent
Greenlee et al.

(10) Patent No.: US 11,594,495 B2
(45) Date of Patent: Feb. 28, 2023

(54) MICROELECTRONIC DEVICES INCLUDING CONDUCTIVE LEVELS HAVING VARYING COMPOSITIONS, AND RELATED MEMORY DEVICES, ELECTRONIC SYSTEMS, AND METHODS

(71) Applicant: Micron Technology, Inc., Boise, ID (US)

(72) Inventors: Jordan D. Greenlee, Boise, ID (US); John D. Hopkins, Meridian, ID (US); Everett A. McTeer, Eagle, ID (US); Yiping Wang, Boise, ID (US); Rajesh Balachandran, Douglas (IE); Rita J. Klein, Boise, ID (US); Yongjun J. Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 95 days.

(21) Appl. No.: 17/209,993

(22) Filed: Mar. 23, 2021

(65) Prior Publication Data
US 2022/0310522 A1 Sep. 29, 2022

(51) Int. Cl.
*H01L 23/538* (2006.01)
*H01L 23/532* (2006.01)
(Continued)

(52) U.S. Cl.
CPC .......... *H01L 23/5386* (2013.01); *G11C 5/025* (2013.01); *G11C 5/06* (2013.01);
(Continued)

(58) Field of Classification Search
CPC ........... H01L 23/5386; H01L 21/76802; H01L 21/76877; H01L 23/53204; H01L 23/5384;
(Continued)

(56) References Cited

U.S. PATENT DOCUMENTS

| 4,641,417 A | 2/1987 | McDavid |
| 7,830,016 B2 | 11/2010 | Meldrim et al. |

(Continued)

FOREIGN PATENT DOCUMENTS

WO 2019036292 A1 2/2019

OTHER PUBLICATIONS

International Search Report for International Application No. PCT/US2022/016271, dated Jun. 7, 2022, 3 pages.
(Continued)

*Primary Examiner* — Karen Kusumakar
(74) *Attorney, Agent, or Firm* — TraskBritt

(57) ABSTRACT

A microelectronic device comprises a stack structure comprising insulative levels vertically interleaved with conductive levels. The conductive levels individually comprise a first conductive structure, and a second conductive structure laterally neighboring the first conductive structure, the second conductive structure exhibiting a concentration of β-phase tungsten varying with a vertical distance from a vertically neighboring insulative level. The microelectronic device further comprises slot structures vertically extending through the stack structure and dividing the stack structure into block structures, and strings of memory cells vertically extending through the stack structure, the first conductive structures between laterally neighboring strings of memory cells, the second conductive structures between the slot structures and strings of memory cells nearest the slot structures. Related memory devices, electronic systems, and methods are also described.

35 Claims, 13 Drawing Sheets

(51) Int. Cl.
*H01L 21/768* (2006.01)
*G11C 5/06* (2006.01)
*G11C 5/02* (2006.01)
*H01L 27/06* (2006.01)

(52) U.S. Cl.
CPC .. *H01L 21/76802* (2013.01); *H01L 21/76877* (2013.01); *H01L 23/5384* (2013.01); *H01L 23/5385* (2013.01); *H01L 23/53204* (2013.01); *H01L 27/0688* (2013.01)

(58) Field of Classification Search
CPC . H01L 23/5385; H01L 27/0688; H01L 27/10; G11C 5/025; G11C 5/06
See application file for complete search history.

(56) References Cited

U.S. PATENT DOCUMENTS

| | | |
|---|---|---|
| 9,159,739 B2 | 10/2015 | Makala et al. |
| 9,524,779 B2 | 12/2016 | Kai et al. |
| 2009/0142925 A1 | 6/2009 | Ha et al. |
| 2011/0049646 A1* | 3/2011 | Lim .............. H01L 29/7926 257/E21.409 |
| 2013/0168757 A1 | 7/2013 | Hong |
| 2016/0093524 A1 | 3/2016 | Izumi et al. |
| 2017/0148811 A1 | 5/2017 | Zhang et al. |
| 2019/0043876 A1 | 2/2019 | van Schravendijk et al. |
| 2019/0273120 A1 | 9/2019 | Simsek-Ege et al. |
| 2020/0027886 A1 | 1/2020 | Lee |
| 2020/0035700 A1 | 1/2020 | Xu et al. |
| 2020/0051993 A1 | 2/2020 | Rabkin et al. |
| 2020/0373318 A1 | 11/2020 | Wrench et al. |

OTHER PUBLICATIONS

International Written Opinion for International Application No. PCT/US2022/016271, dated Jun. 7, 2022, 4 pages.

Lue et al, "A Novel Double-Trapping BE-SONOS Charge-Trapping NAND Flash Device to Overcome the Erase Saturation without Using Curvature-induced Filed Enhancement Effect or High-K (HK)/Metal Gate (MG) Materials", IEDM vol. 14 (2014), pp. 498-501.

Han et al., "Interface Energy Coupling between B-Tungsten Nanofilm and Few-layered Graphene", Scientific Reports, vol. 7:12213 (2017), 11 pages.

U.S. Appl. No. 16/539,700, filed Aug. 13, 2019, titled "Three-Dimensional Memory With Conductive Rails in Conductive Tiers, and Related Apparatus, Systems, and Methods", to Hopkins et al., 46 pages.

* cited by examiner

MICROELECTRONIC DEVICES INCLUDING CONDUCTIVE LEVELS HAVING VARYING COMPOSITIONS, AND RELATED MEMORY DEVICES, ELECTRONIC SYSTEMS, AND METHODS

TECHNICAL FIELD

The disclosure, in various embodiments, relates generally to the field of microelectronic device design and fabrication. More specifically, the disclosure relates to microelectronic devices and apparatuses including conductive levels each comprising a first conductive structure and a second conductive structure laterally neighboring the first conductive structure, and to related memory devices, electronic systems, and methods of forming the microelectronic devices.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in a stack of tiers of conductive structures (e.g., word lines) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., the word lines) so that memory cells in the vertical memory array can be uniquely selected for writing, reading, or erasing operations. One method of forming such an electrical connection includes forming so-called at least one "staircase" (or "stair step") structure at edges (e.g., horizontal ends) of the tiers of conductive structures. The staircase structure includes individual "steps" providing contact regions of the conductive structures upon which conductive contact structures can be positioned to provide electrical access to the conductive structures.

As vertical memory array technology has advanced, additional memory density has been provided by forming vertical memory arrays to include stacks comprising additional tiers of conductive structures and, hence, additional staircase structures and/or additional steps in individual staircase structures associated therewith. As the thickness of each tier decreases to increase the number of tiers within a given height of the stack, the resistivity of the conductive structures may increase and the conductivity may exhibit a corresponding decrease. In addition, as the thickness of each tier decreases to increase the number of tiers within a given height of the stack, the resistivity of the conductive structures may increase and the conductivity may exhibit a corresponding decrease. However, the conductivity of the conductive structures affects the performance of the memory cells of the vertical memory strings, such as the threshold voltage required to access the memory cells and the erase voltage for erase data from the memory cells.

BRIEF DESCRIPTION OF THE DRAWINGS

FIG. 1A through FIG. 1J are simplified partial cross-sectional views (FIG. 1A, FIG. 1C, FIG. 1E, FIG. 1F, and FIG. 1H through FIG. 1J) and simplified partial top-down views (FIG. 1B, FIG. 1D, FIG. 1G) illustrating a method of forming a microelectronic device structure, in accordance with embodiments of the disclosure;

DETAILED DESCRIPTION

Figure 1A:
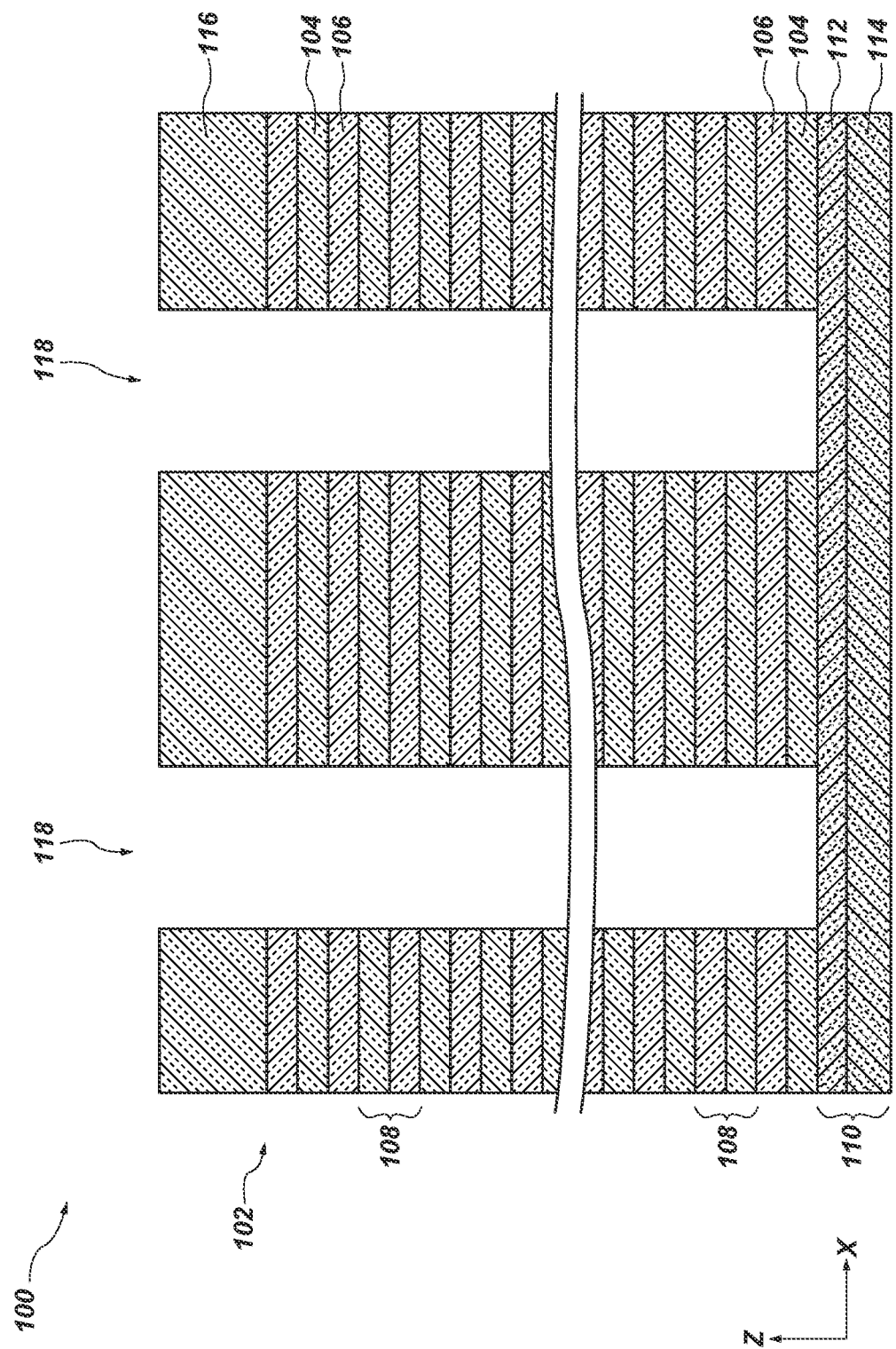

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device, such as DRAM memory device), apparatus, memory device, or electronic system, or a complete microelectronic device, apparatus, memory device, or electronic system including some conductive structures (e.g., select gate structures) exhibiting a greater conductivity than other conductive structures. The structures described below do not form a complete microelectronic device, apparatus, memory device, or electronic system. Only those process acts and structures necessary to understand the embodiments described herein are described in detail below. Additional acts to form a complete microelectronic device, apparatus, memory device, or electronic system from the structures may be performed by conventional techniques.

Unless otherwise specified, materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessary limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

According to embodiments described herein, a microelectronic device comprises a stack structure comprising a vertically alternating sequence of insulative structures and conductive levels. Strings of memory cells vertically extend through the stack structure. The conductive levels each include a first conductive structure and a second conductive structure laterally neighboring the first conductive structure. The first conductive structures may comprise a conductive liner material and a conductive material comprising tungsten, such as alpha-phase (α-phase) tungsten. The first conductive structure may laterally neighbor the strings of memory cells and may include one or more materials facilitating operation of the memory cells. The second conductive structures may comprise tungsten having a different composition than the first conductive structures, such as beta-phase (β-phase) tungsten. The second conductive structures may exhibit a larger grain size than the grain size of the first conductive structures, facilitating an increased conductivity of the second conductive structures relative to the first conductive structures. In some embodiments, the second conductive structures comprise a gradient of the β-phase tungsten and further comprise α-phase tungsten. In some embodiments, the second conductive structures are substantially free of dopants (e.g., boron, aluminum, gallium, arsenic, phosphorus, antimony, bismuth). The first conductive structures may exhibit properties to facilitate improved performance of the memory cells of the vertical strings of memory cells while the second conductive structures exhibit a conductivity greater than a conductivity of the first conductive structures.

The microelectronic device may be formed by forming slots through a stack structure comprising a vertically alternating sequence of the insulative structures and additional insulative structures. Pillars comprising memory cell materials may be formed to vertically extend through the stack structure. The additional insulative structures are selectively removed (e.g., exhumed) through the slots. First conductive structures are formed between vertically neighboring insulative structures to form the vertical strings of memory cells. Portions of each of the first conductive structures are removed and a sacrificial material (e.g., a liner material) is formed in contact with the vertically neighboring insulative structures. For example, portions of the first conductive structures distal from the strings of memory cells may be selectively removed while the first conductive structures remain laterally neighboring the strings of memory cells. The sacrificial material is converted to a conductive material and additional conductive material is formed on the conductive material to form the second conductive structures. Thus, the conductive levels between vertically neighboring insulative structures include the first conductive structures laterally neighboring the strings of memory cells and the second conductive structures laterally neighboring the first conductive structures.

FIG. 1A through FIG. 1J illustrate a method of forming a microelectronic device structure, in accordance with embodiments of the disclosure. FIG. 1A is a simplified cross-sectional view of a microelectronic device structure 100 taken through section line A-A of FIG. 1B. The microelectronic device structure 100 may, for example, be formed into a portion of a memory device (e.g., a multi-deck 3D NAND Flash memory device, such as a dual-deck 3D NAND Flash memory device), as described in further detail below.

With reference to FIG. 1A, the microelectronic device structure 100 includes a stack structure 102 including a vertically alternating (e.g., in the Z-direction) sequence of insulative structures 104 (also referred to herein as "insulative levels") and additional insulative structures 106 (also referred to herein as "additional insulative levels") arranged in tiers 108. Each of the tiers 108 of the stack structure 102 may include at least one (1) of the insulative structures 104 vertically neighboring at least one (1) of the additional insulative structures 106. The insulative structures 104 and the additional insulative structures 106 may be interleaved with each other.

The insulative structures 104 may each individually be formed of and include, for example, an insulative material, such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), and amorphous carbon. In some embodiments, the insulative structures 104 comprise silicon dioxide. Each of the insulative structures 104 may individually include a substantially homogeneous distribution of the at least one insulating material, or a substantially heterogeneous distribution of the at least one insulating material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the insulative structures 104 of each of the tiers 108 of the stack structure 102 exhibits a substantially homogeneous distribution of insulative material. In additional embodiments, at least one of the insulative structures 104 of at least one of the tiers 108 of the stack structure 102 exhibits a substantially heterogeneous distribution of at least one insulative material. The insulative structures 104 may, for example, be formed of and include a stack (e.g., laminate) of at least two different insulative materials. The insulative structures 104 of each of the tiers 108 of the stack structure 102 may each be substantially planar, and may each individually exhibit a desired thickness.

The levels of the additional insulative structures 106 may be formed of and include an insulative material that is different than, and exhibits an etch selectivity with respect to, the insulative structures 104. In some embodiments, the additional insulative structures 106 are formed of and include a nitride material (e.g., silicon nitride ($Si_3N_4$)) or an oxynitride material (e.g., silicon oxynitride). In some embodiments, the additional insulative structures 106 comprise silicon nitride.

Although FIG. 1A illustrates a particular number of tiers 108 of the insulative structures 104 and the additional insulative structures 106, the disclosure is not so limited. In some embodiments, the stack structure 102 includes a desired quantity of the tiers 108, such as within a range from thirty-two (32) of the tiers 108 to two hundred fifty-six (256) of the tiers 108. In some embodiments, the stack structure 102 includes sixty-four (64) of the tiers 108. In other embodiments, the stack structure 102 includes a different number of the tiers 108, such as less than sixty-four (64) of the tiers 108 (e.g., less than or equal to sixty (60) of the tiers 108, less than or equal to fifty (50) of the tiers 108, less than about forty (40) of the tiers 108, less than or equal to thirty (30) of the tiers 108, less than or equal to twenty (20) of the tiers 108, less than or equal to ten (10) of the tiers 108); or greater than sixty-four (64) of the tiers 108 (e.g., greater than or equal to seventy (70) of the tiers 108, greater than or equal to one hundred (100) of the tiers 108, greater than or equal to about one hundred twenty-eight (128) of the tiers 108, greater than two hundred fifty-six (256) of the tiers 108) of the insulative structures 104 and the additional insulative structures 106. In addition, in some embodiments, the stack structure 102 overlies a deck structure comprising additional tiers 108 of insulative structures 104 and the additional insulative structures, separated from the stack structure 102 by at least one dielectric material, such as an interdeck insulative material.

With continued reference to FIG. 1A, the microelectronic device structure 100 further includes a source tier 110 vertically underlying (e.g., in the Z-direction) the stack structure 102. The source tier 110 may comprise, for example, a first source material 112 and a second source material 114. The first source material 112 may be formed of and include at least one conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy), a conductive metal-containing material (e.g., a conductive metal nitride, a conductive metal silicide, a conductive metal carbide, a conductive metal oxide), or a doped semiconductor material (e.g., a semiconductor material doped with one or more P-type dopants (e.g., polysilicon doped with at least one P-type dopant, such as one or more of boron, aluminum, and gallium) or one or more N-type conductivity materials (e.g., polysilicon doped with at least one N-type dopant, such as one or more of arsenic, phosphorous, antimony, and bismuth)). In some embodiments, the first source material 112 comprises conductively-doped silicon.

The second source material 114 may be formed of and include one or more of a metal silicide material (e.g., tungsten silicide ($WSi_x$)), a metal nitride material (e.g., tungsten nitride), and a metal silicon nitride material (e.g., tungsten silicon nitride ($WSi_xN_y$)). In some embodiments, the second source material 114 comprises tungsten silicide.

A dielectric material 116 may vertically (e.g., in the Z-direction) overlie a vertically uppermost tier 108 of the insulative structures 104 and the additional insulative structures 106. The dielectric material 116 may comprise one or more of the materials described above with reference to the insulative structures 104. In some embodiments, the dielectric material 116 comprises silicon dioxide.

Figure 1B:
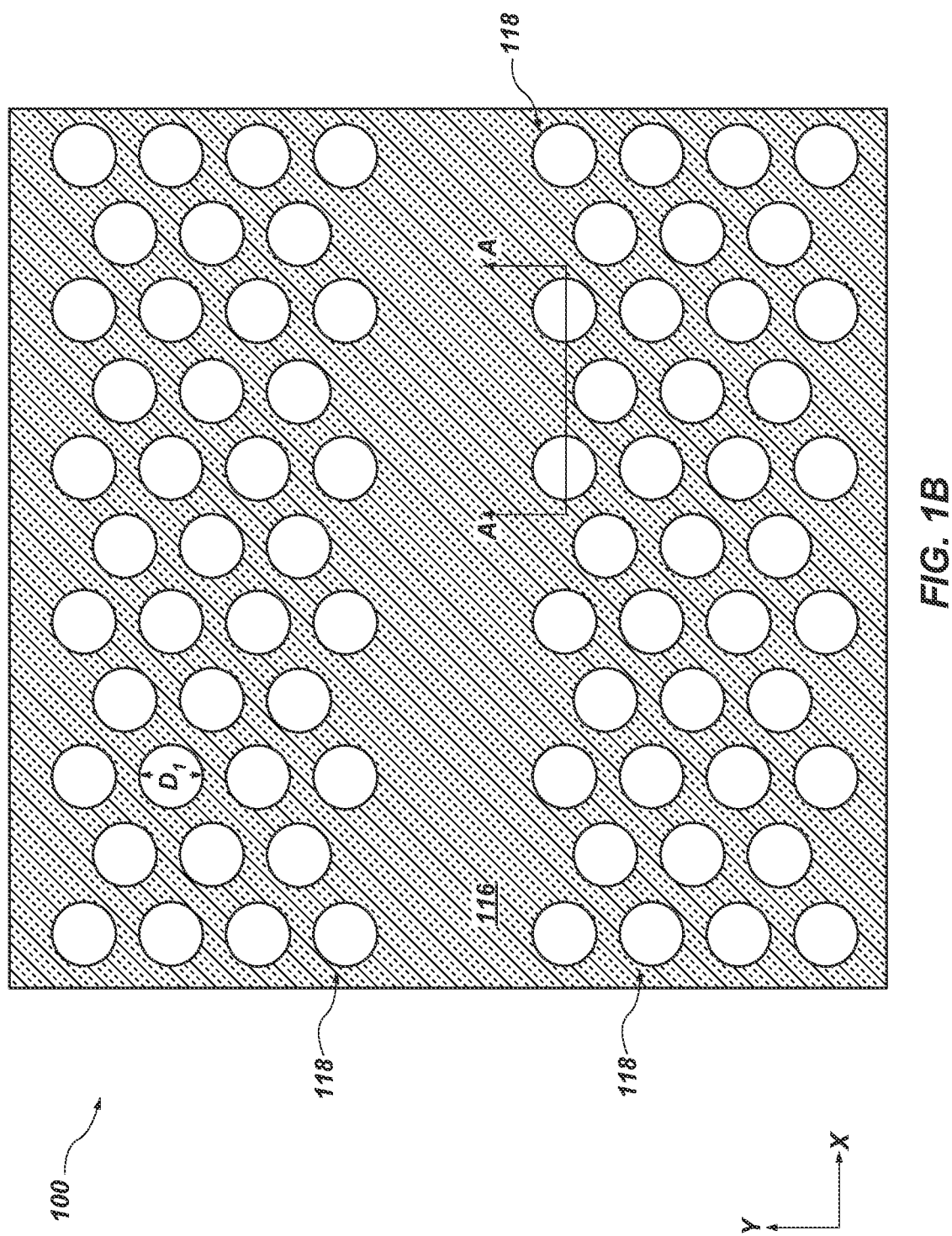

With continued reference to FIG. 1A and FIG. 1B, openings 118 may be formed through the stack structure 102 to, for example, expose a portion of the source tier 110 (e.g., a portion of the first source material 112). As will be described herein, the openings 118 may be used to form pillars 120 (FIG. 1C) for forming strings (e.g., strings 170 (FIG. 1F)) of memory cells (e.g., memory cells 172 (FIG. 1F)).

Referring to FIG. 1B, openings 118 that laterally neighbor one another in the Y-direction may be offset from each other in the X-direction. Accordingly, the openings 118 may be arranged in a so-called weave pattern, which may facilitate an increased density of the pillars 120 (and the resulting strings (e.g., strings 170 (FIG. 1F)) of memory cells (e.g., memory cells 172 (FIG. 1F))) to be formed in the openings 118. However, the disclosure is not so limited and the openings 118 may be arranged in other patterns (e.g., lines wherein the openings 118 of each line are aligned with openings 118 of each of the other lines). In some embodiments, each opening 118 may be surrounded by six (6) other openings 118 and may be arranged in a hexagonal pattern.

The openings 118 may have a horizontal dimension (e.g., diameter) $D_1$ within a range from about 60 nanometers (nm) to about 120 nm, such as from about 60 nm to about 80 nm, from about 80 nm to about 100 nm, or from about 100 nm to about 120 nm. In some embodiments, the horizontal dimension $D_1$ is about 100. However, the disclosure is not so limited and the horizontal dimension $D_1$ may be different than those described.

Figure 1C:
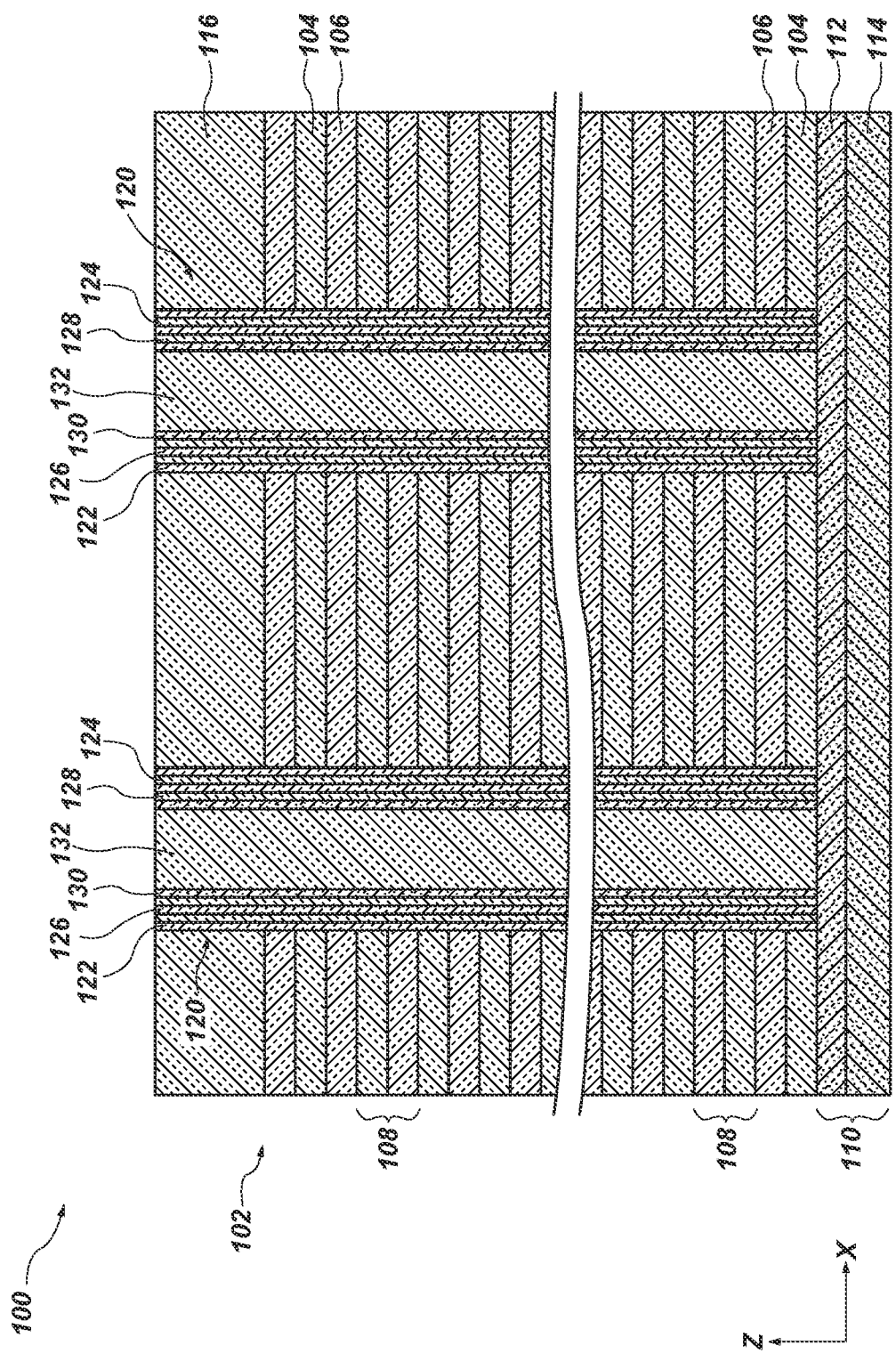
Figure 1D:
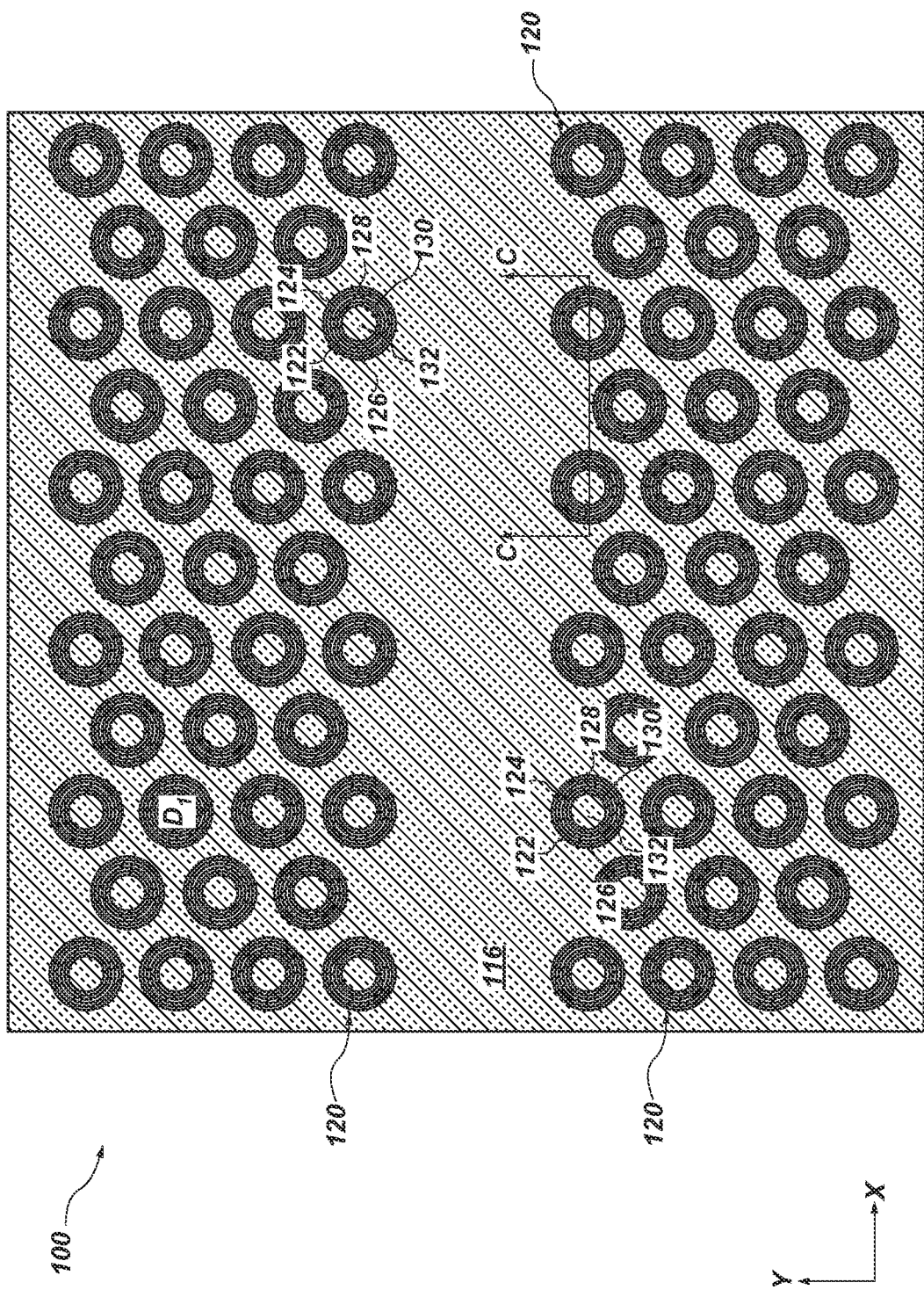

Referring to FIG. 1C and FIG. 1D, after forming the openings 118, one or more materials may be formed within the openings to form pillars 120 including the one or more materials. FIG. 1C is a simplified cross-sectional view of the microelectronic device structure 100 taken through section line C-C of FIG. 1D, which is a simplified top view of the microelectronic device structure 100. With reference to FIG. 1C and FIG. 1D, the pillars 120 may vertically extend (e.g., in the Z-direction) through the stack structure 102. As will be described herein, the materials of the pillars 120 may be employed to form memory cells (e.g., strings of NAND memory cells). The pillars 120 may each individually comprise a barrier material 122 horizontally neighboring the levels of the insulative structures 104 and the additional insulative structures 106 of one of the tiers 108 of the stack structure 102; a charge blocking material (also referred to as a "dielectric blocking material") 124 horizontally neighboring the barrier material 122; a memory material 126 horizontally neighboring the charge blocking material 124; a tunnel dielectric material (also referred to as a "tunneling dielectric material") 128 horizontally neighboring the memory material 126; a channel material 130 horizontally neighboring the tunnel dielectric material 128; and an insulative material 132 in a center portion of the pillars 120. The channel material 130 may be horizontally interposed between the insulative material 132 and the tunnel dielectric material 128; the tunnel dielectric material 128 may be horizontally interposed between the channel material 130 and the memory material 126; the memory material 126 may be horizontally interposed between the tunnel dielectric material 128 and the charge blocking material 124; the charge blocking material 124 may be horizontally interposed between the memory material 126 and the barrier material 122; and the barrier material 122 may be horizontally interposed between the charge blocking material 124 and the levels of the insulative structures 104 and additional insulative structures 106.

In some embodiments, the pillars 120 do not include the barrier material 122 and the charge blocking material 124 horizontally neighbors the levels of the insulative structures 104 and additional insulative structures 106.

The barrier material 122 may be formed of and include one or more of a metal oxide (e.g., one or more of aluminum oxide, hafnium oxide, zirconium oxide, lanthanum oxide, yttrium oxide, tantalum oxide, gadolinium oxide, niobium oxide, titanium oxide), a dielectric silicide (e.g., aluminum silicide, hafnium silicate, zirconium silicate, lanthanum silicide, yttrium silicide, tantalum silicide), and a dielectric nitride (e.g., aluminum nitride, hafnium nitride, lanthanum nitride, yttrium nitride, tantalum nitride). In some embodiments, the barrier material 122 comprises aluminum oxide.

The charge blocking material 124 may be formed of and include a dielectric material such as, for example, one or more of an oxide (e.g., silicon dioxide), a nitride (silicon nitride), and an oxynitride (silicon oxynitride), or another material. In some embodiments, the charge blocking material 124 comprises silicon oxynitride.

The memory material 126 may comprise a charge trapping material or a conductive material. The memory material 126 may be formed of and include one or more of silicon nitride, silicon oxynitride, polysilicon (doped polysilicon), a conductive material (tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material polycrystalline or amorphous semiconductor material including at least one elemental semiconductor element or at least one compound semiconductor material, conductive nanoparticles (e.g., ruthenium nanoparticles), metal dots. In some embodiments, the memory material 126 comprises silicon nitride.

The tunnel dielectric material 128 may be formed of and include a dielectric material through which charge tunneling can be performed under suitable electrical bias conditions, such as through hot-carrier injection or by Fowler-Nordheim tunneling induced charge transfer. By way of non-limiting example, the tunnel dielectric material 128 may be formed of and include one or more of silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In some embodiments, the tunnel dielectric material 128 comprises silicon dioxide. In other embodiments, the tunnel dielectric material 128 comprises nitrogen, such as an oxynitride. In some such embodiments, the tunnel dielectric material 128 comprises silicon oxynitride.

In some embodiments the tunnel dielectric material 128, the memory material 126, and the charge blocking material 124 together may comprise a structure configured to trap a charge, such as, for example, an oxide-nitride-oxide (ONO) structure. In some such embodiments, the tunnel dielectric material 128 comprises silicon dioxide, the memory material 126 comprises silicon nitride, and the charge blocking material 124 comprises silicon dioxide. In other embodiments, the tunnel dielectric material 128, the memory material 126, and the charge blocking material 124 together comprise an oxide-nitride-oxynitride structure. In some such embodiments, the tunnel dielectric material 128 comprises silicon oxynitride, the memory material 126 comprises silicon nitride, and the charge blocking material 124 comprises silicon dioxide.

The channel material 130 may be formed of and include one or more of a semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and an oxide semiconductor material. In some embodiments, the channel material 130 includes amorphous silicon or polysilicon. In some embodiments, the channel material 130 comprises a doped semiconductor material.

The insulative material 132 may be formed of and include an electrically insulative material such as, for example, phosphosilicate glass (PSG), borosilicate glass (BSG), fluorosilicate glass (FSG), borophosphosilicate glass (BPSG), silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), or combinations thereof. In some embodiments, the insulative material 132 comprises silicon dioxide.

After forming the pillars 120, vertically (e.g., in the Z-direction) surfaces of the microelectronic device structure 100 may be exposed to a chemical mechanical planarization (CMP) process to remove laterally (e.g., in the X-direction, in the Y-direction) portions of the barrier material 122, the charge blocking material 124, the memory material 126, the tunnel dielectric material 128, the channel material 130, and the insulative material 132.

Figure 1E:
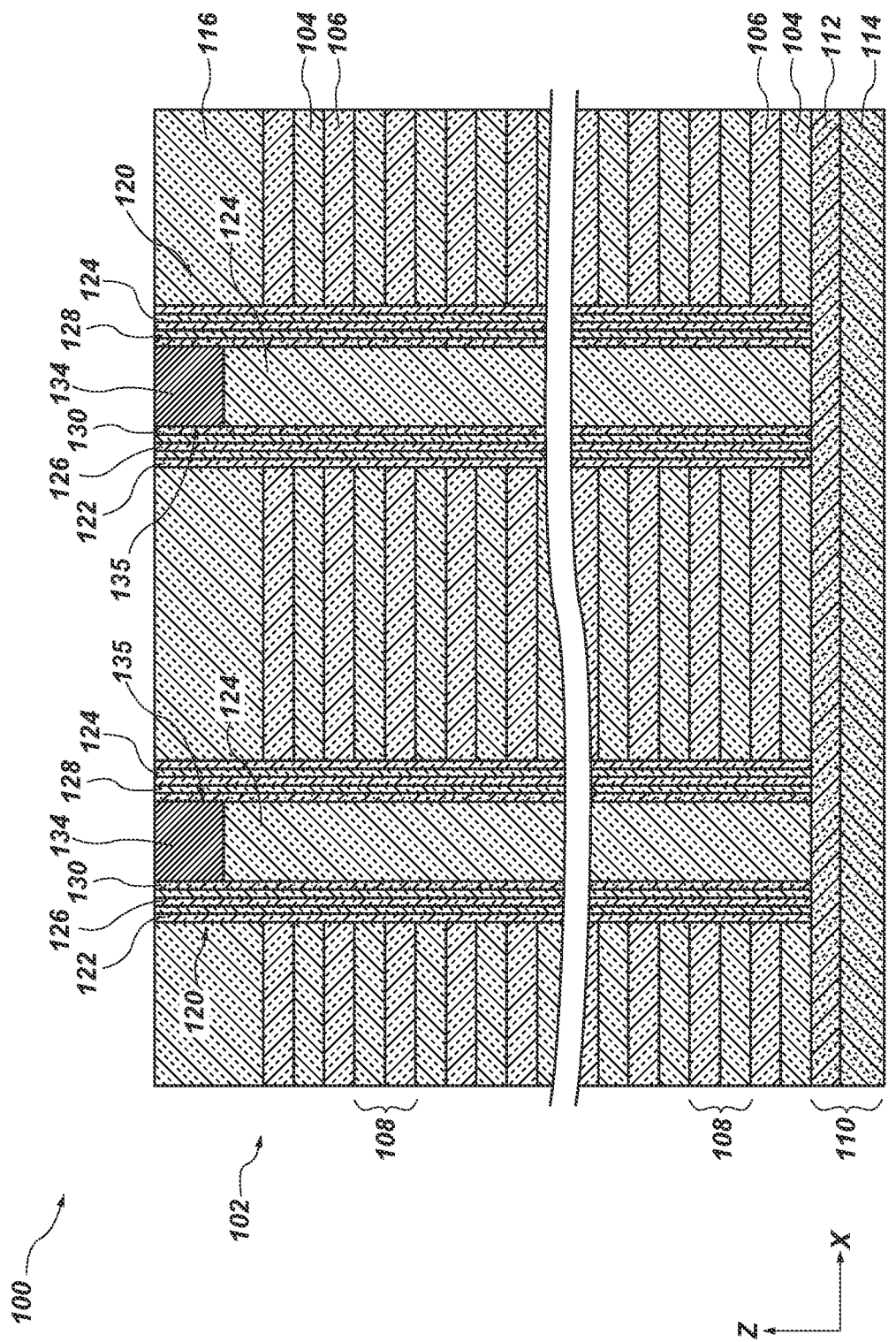

With reference now to FIG. 1E, a conductive contact structure 135 may be formed in electrical communication with the channel material 130 of the pillars 120. For example, in some embodiments, a portion of the insulative material 132 within the pillars 120 may be selectively removed to form a recessed portion in each of the pillars 120. After selectively removing the insulative material 132, a conductive material 134 may be formed within the recess of each pillar 120 and in electrical communication with the channel material 130.

In other embodiments, the insulative material 132 of each pillar 120 may not be recessed. In some such embodiments, a mask material, such as a dielectric material may be formed over the microelectronic device structure 100. Openings may be formed in the dielectric material at locations corresponding to the locations of the pillars 120 to expose upper (e.g., in the Z-direction) portions of the channel material 130. The conductive material 134 may be formed in the openings and in electrical communication with the channel material 130. In some embodiments, an additional channel material (e.g., such as a liner) is formed within the openings and in electrical communication with the channel material 130 and the conductive material 134 is formed in remaining portions of the openings and in electrical communication with the additional channel material.

The conductive contact structure 135 may be in electrical communication with, for example, a conductive line for providing access to strings (e.g., strings 170 (FIG. 1F)) of memory cells (e.g., memory cells 172 (FIG. 1F)) formed from the pillars 120.

Figure 1F:
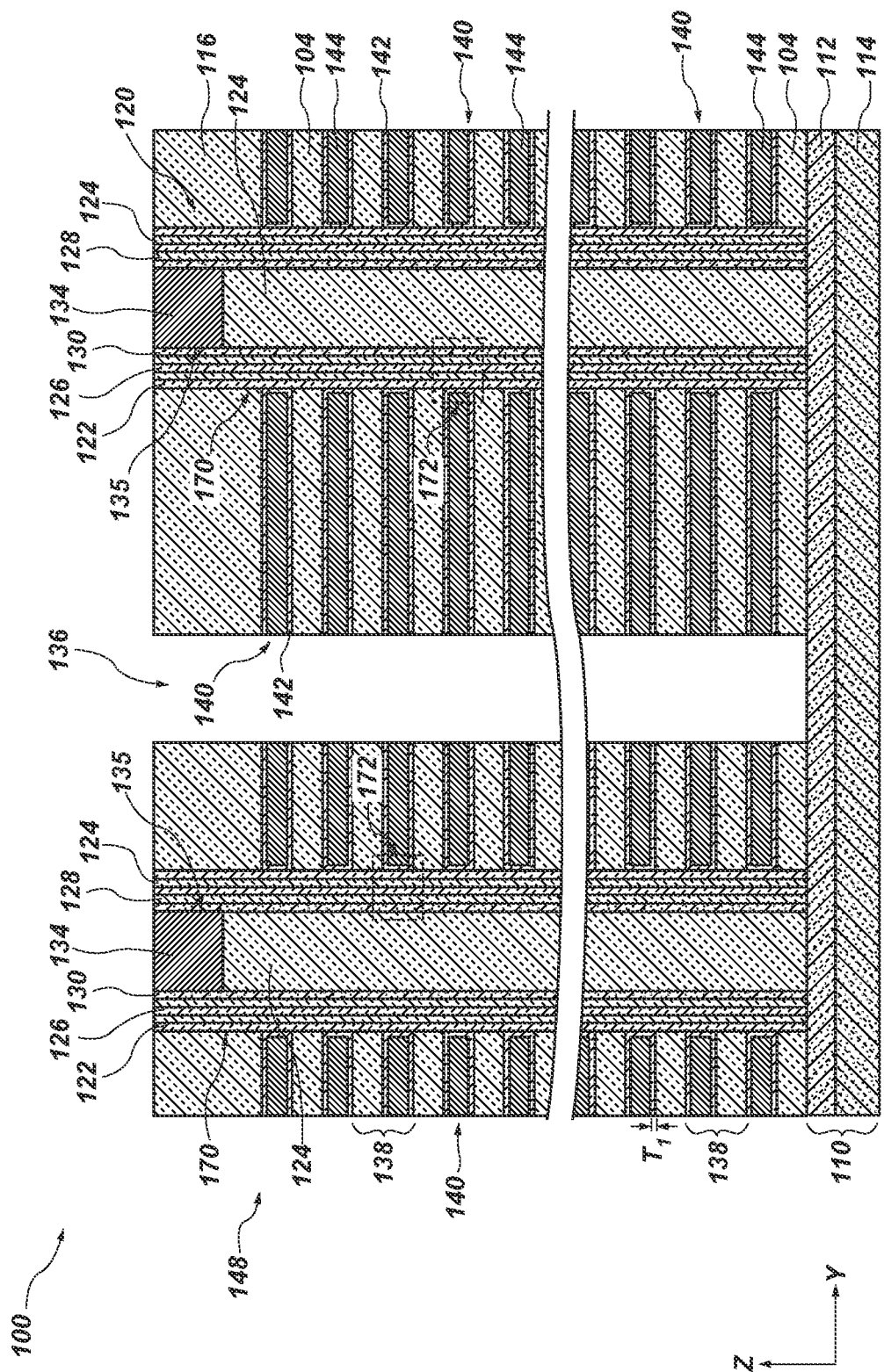
Figure 1G:
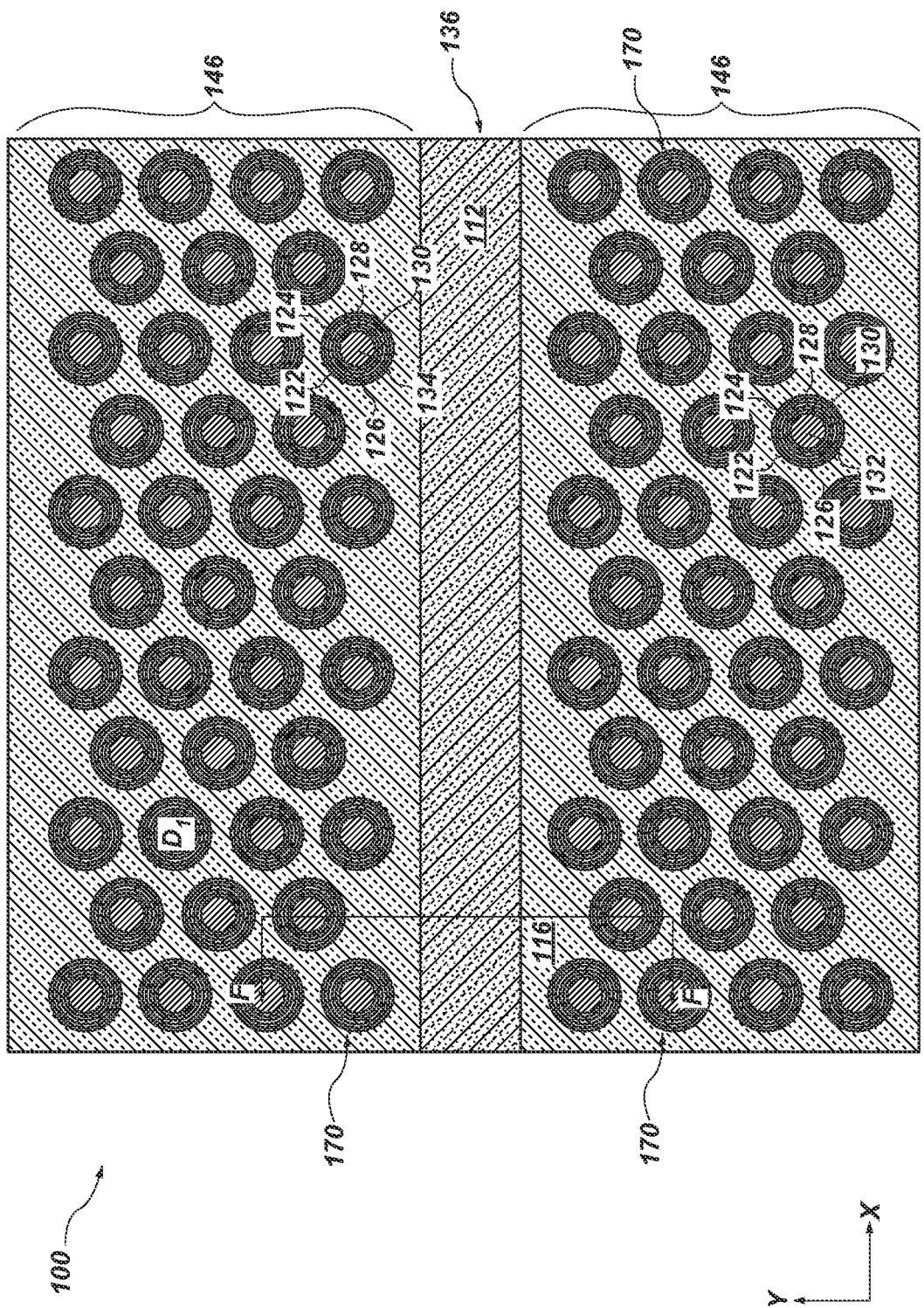

With combined reference to FIG. 1F and FIG. 1G, after forming the pillars 120 (FIG. 1E), slots 136 (also referred to herein as "replacement gate slots") may be formed through the stack structure 102 to facilitate replacement of the additional insulative structures 106 (FIG. 1E) to form first conductive structures 140 comprising a conductive liner material 142 and a conductive material 144 through so-called "replacement gate" or "gate last" processing acts and to form block structures 146 in the microelectronic device structure 100 separated from each other by the slots 136. FIG. 1F is a simplified cross-sectional view of the microelectronic device structure 100 taken through section line F-F of FIG. 1G, which is a top view of the microelectronic device structure 100. The slots 136 may extend through the dielectric material 116, and the tiers 108 of the insulative structures 104 and the additional insulative structures (FIG. 1E). In some embodiments, the slots 136 may expose the source tier 110, such as the first source material 112.

The additional insulative structures 106 (FIG. 1E) may be selectively removed (e.g., exhumed) through the slots 136. Spaces between vertically neighboring (e.g., in the Z-direction) insulative structures 104 may be filled with the conductive liner material 142 and the conductive material 144 to form the first conductive structures 140 and a stack structure 148 including tiers 138 of the insulative structures 104 and the first conductive structures 140 comprising the conductive liner material 142 and the conductive material 144. The first conductive structures 140 may be located at locations corresponding to the locations of the additional insulative structures 106 removed through the slots 136.

Although FIG. 1F and FIG. 1G illustrate only one slot 136 and only two block structures 146, the disclosure is not so limited. The microelectronic device structure 100 may include a plurality of (e.g., four, five, six, eight) block structures 146, each separated from laterally neighboring (e.g., in the Y-direction) block structures 146 by a slot 136. In other words, the slots 136 may divide the microelectronic device structure 100 into any desired number of block structures 146.

The conductive material 144 of the first conductive structures 140 may be formed of and include at least one conductive material, such as at least one metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), at least one conductively-doped semiconductor material (e.g., conductively-doped polysilicon, conductively-doped germanium (Ge), conductively-doped silicon germanium (SiGe)), at least one conductive metal-containing material (e.g., a conductive metal nitride, a conductive metal silicide, a conductive metal carbide, a conductive metal oxide), or combinations thereof. In some embodiments, the conductive material 144 is formed of and includes tungsten. In some embodiments, the conductive material 144 comprises α-phase tungsten and is substantially free of β-phase tungsten.

The conductive material 144 of each of the first conductive structures 140 may individually include a substantially homogeneous composition, or a substantially heterogeneous composition. In some embodiments, the conductive material 144 of each of the first conductive structures 140 of each of the tiers 138 of the stack structure 148 exhibits a substantially homogeneous composition. In additional embodiments, at least one of the first conductive structures 140 of at least one of the tiers 138 of the stack structure 148 exhibits a substantially heterogeneous composition. The conductive material 144 may, for example, be formed of and include at least two different conductive materials. The first conductive structures 140 of each of the tiers 138 of the stack structure 148 may each be substantially planar, and may each exhibit a desired thickness.

The conductive liner material 142 may be in contact with the insulative structures 104 and may be located, for example, between the insulative structures 104 and the conductive material 144 of the first conductive structures 140. The conductive liner material 142 may be formed of and include, for example, a seed material from which the first conductive structures 140 may be formed. The conductive liner material 142 may be formed of and include, for example, a metal (e.g., titanium, tantalum), a metal nitride (e.g., tungsten nitride, titanium nitride, tantalum nitride), or another material. In some embodiments, the conductive liner material comprises titanium nitride. In some embodiments, the conductive liner material 142 comprises a first portion comprising a first material in contact with the insulative structures 104 and a second portion comprising a second material in contact with and between the first material and the conductive material 144. In some embodiments, the first material comprises aluminum oxide and the second material comprises titanium nitride.

A thickness $T_1$ of the conductive liner material 142 may be within a range from about 0.5 nanometer (nm) to about 50 nm, such as from about 0.5 nm to about 1 nm, from about 1 nm to about 5 nm, from about 5 nm to about 10 nm, from about 10 nm to about 30 nm, or from about 30 nm to about 50 nm.

With continued reference to FIG. 1F, formation of the first conductive structures 140 may form strings 170 of memory cells 172, each memory cell 172 located at an intersection of a first conductive structure 140 and the memory cell materials (e.g., the barrier material 122, the charge blocking material 124, the memory material 126, and the tunnel dielectric material 128) and the channel material 130.

Although the microelectronic device structure 100 has been described and illustrated as comprising memory cells 172 having a particular configuration, the disclosure is not so limited. In some embodiments, the memory cells 172 may comprise so-called "MONOS" (metal-oxide-nitride-oxide-semiconductor) memory cells. In additional embodiments, the memory cells 172 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In other embodiments, the memory cells 172 comprise so-called "floating gate" memory cells including floating gates (e.g., metallic floating gates) as charge storage structures. The floating gates may horizontally intervene between central structures of the strings 170 and the first conductive structures 140.

Although FIG. 1F has been described as including the first conductive structures 140 comprising the conductive liner material 142 and the conductive material 144, the disclosure is not so limited. In other embodiments, the first conductive structures 140 do not include the conductive liner material 142 and the conductive material 144 directly contacts the insulative structures 104. In some such embodiments, the conductive material 144 is directly vertically (e.g., in the Z-direction) neighboring and physically contacting the insulative structures 104.

Figure 1H:
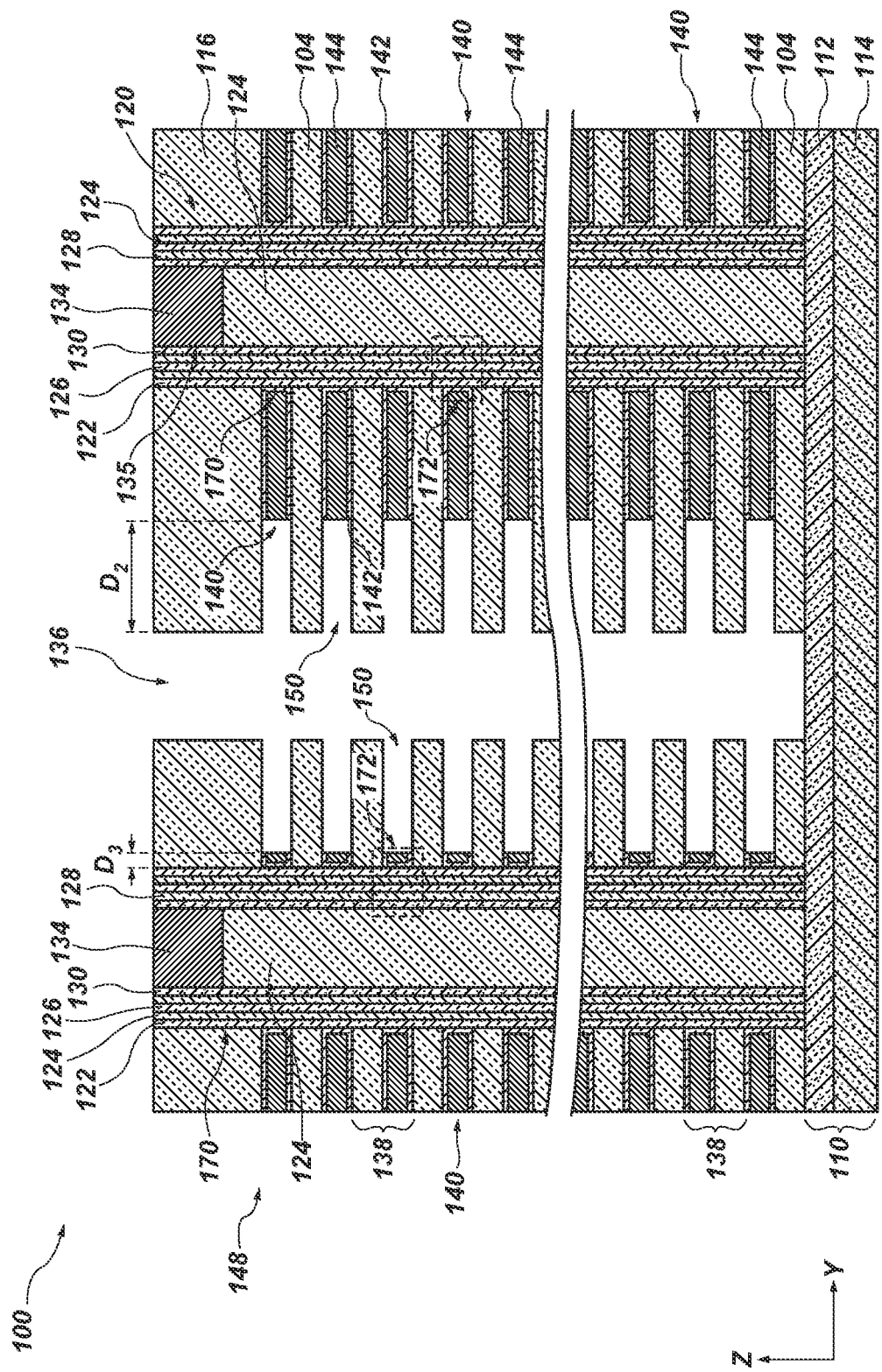
Figure 11:
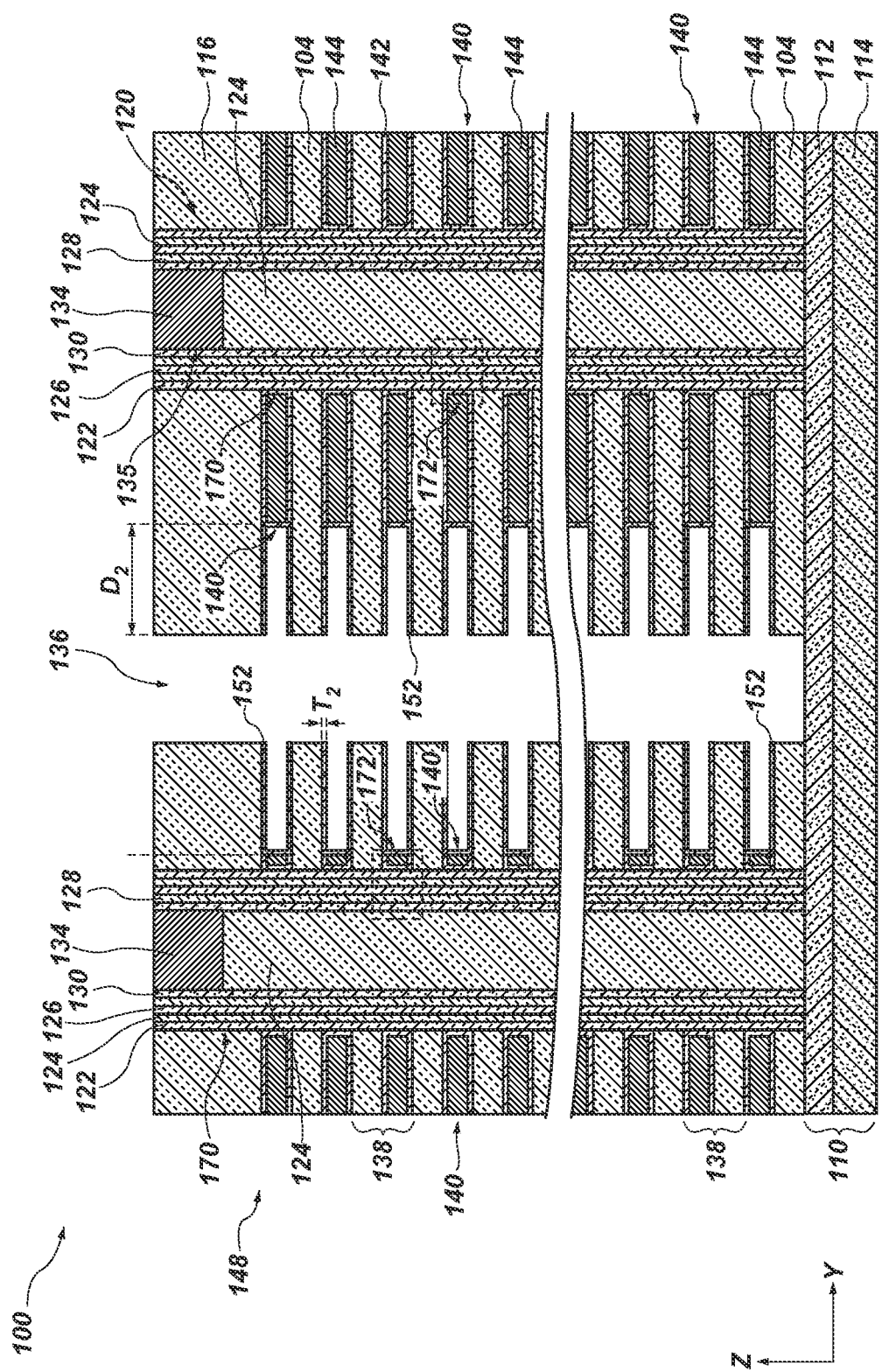

Referring now to FIG. 1H, after forming the first conductive structures 140, portions of the conductive liner material 142 and the conductive material 144 of the first conductive structures 140 may be removed through the slots 136 to form recesses 150. For example, the first conductive structures 140 may be exposed to one or more etch chemistries to selectively remove the conductive liner material 142 and the conductive material 144 through the slots 136. The one or more etch chemistries may include one or more wet etchants, one or more dry etchants, or both. In some embodiments, the first conductive structures 140 are exposed to a wet etchant. In some such embodiments, the first conductive structures 140 may be exposed to one or more of ammonium peroxide (NH$_4$OH) (APM), phosphoric acid, acetic acid, and nitric acid. In some embodiments, the wet etchants include a mixture of phosphoric acid, acetic acid, and nitric acid. In other embodiments, the etchants comprise dry etchants, such as one or more of ammonia (NH$_3$), nitrogen trifluoride (NF$_3$), methyl fluoride (CH$_3$F), fluorine (F$_2$), chlorine trifluoride (ClF$_3$), or another material. In some embodiments, the dry etchant comprises ammonia.

In some embodiments, a distance $D_2$ between a vertically (e.g., in the Z-direction) extending sidewall defining the slot 136 and a lateral (e.g., in the X-direction, in the Y-direction) portion of the first conductive structure 140 may be within a range from about 1 nm to about 100 nm, such as from about 1 nm to about 10 nm, from about 10 nm to about 20 nm, from about 20 nm to about 40 nm, from about 40 nm to about 60 nm, from about 60 nm to about 80 nm, or from about 80 nm to about 100 nm. In some embodiments, the distance $D_2$ may be within a range from about 1 nm to about 20 nm. In other embodiments, the distance $D_2$ is within a range from about 20 nm to about 40 nm. However, the disclosure is not so limited and the distance $D_2$ may be different than those described. In some embodiments, the distance $D_2$ may be based, at least partially, on the duration during which the first conductive structures 140 are exposed to the one or more etch chemistries through the slot 136.

In some embodiments, the distance $D_2$ in a first lateral direction (e.g., in the Y-direction, such as in the right direction in the view of FIG. 1H) from the slot 136 may be substantially the same as the distance $D_2$ in an opposite lateral direction (e.g., in the left direction in the view of FIG. 1H). In other embodiments, the distance $D_2$ in the first lateral direction and the opposite lateral direction may not be substantially the same.

A distance $D_3$ between the pillar 120 and the lateral edge (e.g., in the Y-direction) of the vertically (e.g., in the Z-direction) extending sidewall defining the recess 150 proximate the pillar 120 may be within a range from about 1 nm to about 10 nm, such as from about 1 nm to about 5 nm, or from about 5 nm to about 10 nm. However, the disclosure is not so limited and the distance $D_3$ may be different than that described above. In some embodiments, the distance $D_3$ between the pillars 120 in a first lateral direction (e.g., in the left direction in the view of FIG. 1H) from the slots 136 and the lateral edge of the vertically extending sidewall defining the recess 150 may be different than the distance $D_3$ between the pillars 120 in a second, opposite lateral direction (e.g., in the right direction in the view of FIG. 1H) from the slots 136 and the lateral edge of the vertically extending sidewall defining the recess 150. In other words, since the nearest pillars 120 to the slots 136 in a first lateral direction (e.g., in the left direction in the view of FIG. 1H) are located a different distance from the slots 136 than nearest pillars 120 in an opposite lateral direction (e.g., in the right direction in the view of FIG. 1H), the distance $D_3$ may be different on different lateral sides of the slots 136.

With reference now to FIG. 1I, a sacrificial material 152 may be formed on surfaces defining the recesses 150 (FIG. 1H), such as on surfaces of the insulative structures 104 and the first conductive structures 140. For example, the sacrificial material 152 may be formed on vertically (e.g., in the Z-direction) opposing surfaces of the insulative structures 104 and on the vertically extending surfaces of the conductive liner material 142 and the conductive material 144 of the first conductive structure 140. The sacrificial material 152 may be formed by one or more of ALD, CVD, plasma enhanced ALD, PVD, PECVD, and LPCVD.

A thickness $T_2$ of the sacrificial material 152 may be within a range from about 0.5 nm to about 100 nm, such as from about 0.5 to about 1 nm, from about 1 nm to about 5 nm, from about 5 nm to about 10 nm, from about 10 nm to about 30 nm, from about 30 nm to about 50 nm, or from about 50 nm to about 100 nm. In some embodiments, the thickness $T_2$ of the sacrificial material 152 is substantially the same as the thickness $T_1$ of the conductive liner material 142. In some such embodiments, major surfaces of the sacrificial material 152 are substantially planar with major surfaces of the conductive liner material 142. In other embodiments, the thickness $T_2$ of the sacrificial material 152 is less than the thickness $T_1$ of the conductive liner material 142. In yet other embodiments, the thickness $T_2$ of the sacrificial material 152 is greater than the thickness $T_1$ of the conductive liner material 142.

The sacrificial material 152 may be formed of and include a material having different etch selectivity than the insulative structures 104. The sacrificial material 152 may, for example, be selectively etchable relative to insulative material of the insulative structures 104 during mutual exposure to an etchant. As a non-limiting example, the sacrificial material 152 may be formed of and include at least one semiconductive material (e.g., silicon, doped silicon, a silicon-germanium material, a boron material, a germanium material, a gallium arsenide material, a gallium nitride material, and an indium phosphide material, polysilicon, doped polysilicon), or silicon nitride.

In embodiments where the sacrificial material 152 is doped, the dopant may include one or more of at least one N-type dopant (such as one or more of phosphorus (P), arsenic (Ar), antimony (Sb), and bismuth (Bi)), at least one P-type dopant (such as one or more of boron (B), aluminum (Al), and gallium (Ga)), carbon (C), fluorine (F), chlorine (Cl), bromine (Br), hydrogen (H), deuterium ($^2$H), helium (He), neon (Ne), and argon (Ar). In some embodiments, an amount of dopant within the sacrificial material 152 is within a range of from about 0.001 atomic percent to about 10 atomic percent, such as from about 0.001 atomic percent to about 0.1 atomic percent, from about 0.1 atomic percent to about 0.5 atomic percent, from about 0.5 atomic percent to about 1.0 atomic percent, from about 1.0 atomic percent to about 2.0 atomic percent, from about 2.0 atomic percent to about 5.0 atomic percent, or from about 5.0 atomic percent to about 10.0 atomic percent. The individual portions of the sacrificial material 152 may individually exhibit a substantially homogeneous distribution of dopant(s) within the material thereof, or may individually exhibit a heterogeneous distribution of dopant(s) within the material thereof. In some embodiments, the sacrificial material 152 comprises polysilicon. In some embodiments, the sacrificial material 152 comprises doped polysilicon. In some embodiments, the sacrificial material 152 comprises undoped polysilicon. In other words, the sacrificial material 152 may be substantially free of dopants.

The sacrificial material 152 may be formed by exposing the insulative structures 104 to, for example, dichlorosilane (SiH$_2$Cl$_2$) and silane through the slots 136. In some embodiments, the sacrificial material 152 comprises polysilicon formed by exposing the microelectronic device structure 100 to dichlorosilane and silane.

Figure 1J:
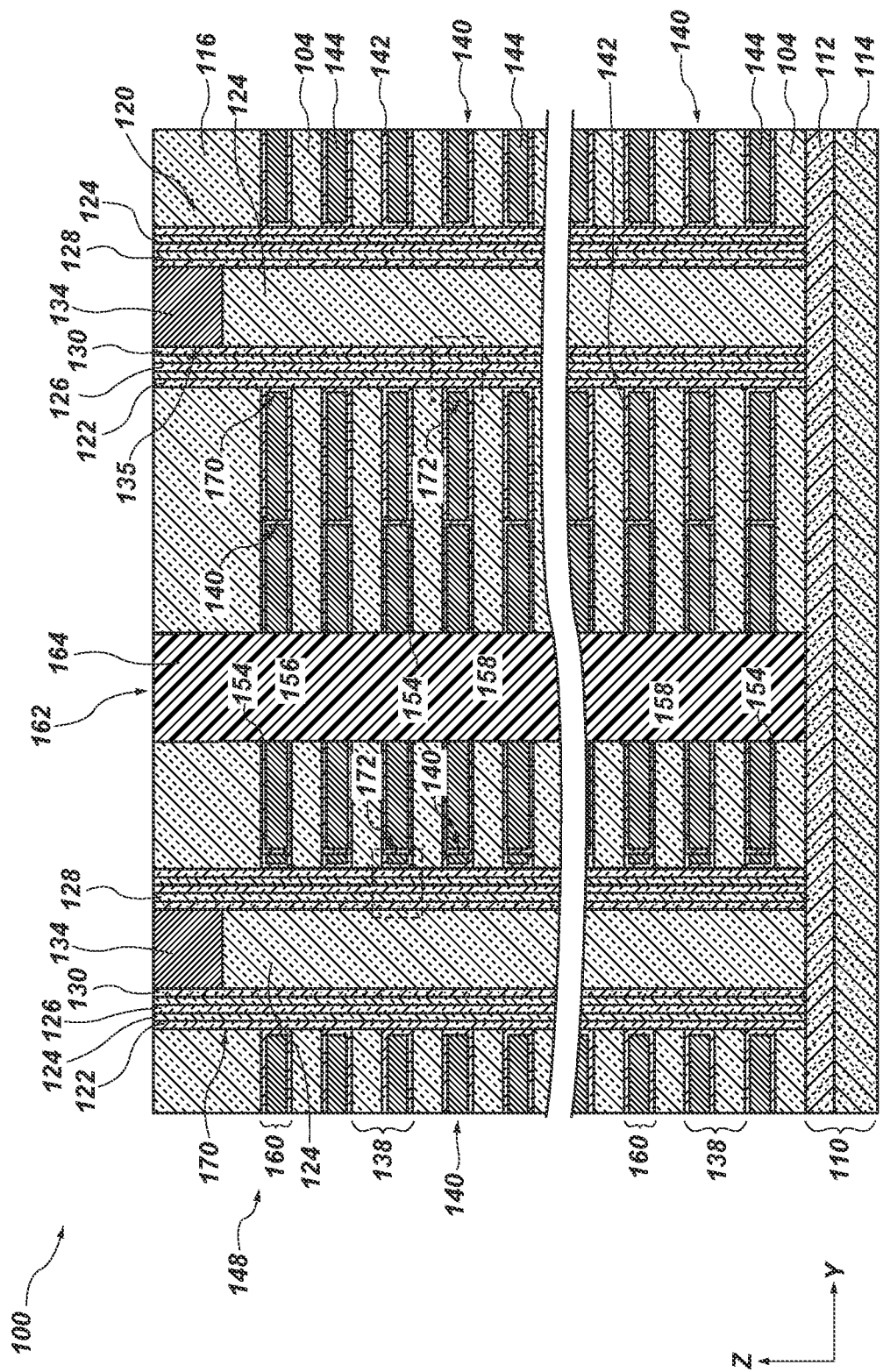

Referring now to FIG. 1J, the sacrificial material 152 (FIG. 1I) may be replaced with (e.g., converted into) a first conductive material 154. After forming the first conductive material 154, a second conductive material 156 may be formed on the first conductive material 154 to form second conductive structures 158 comprising the first conductive material 154 and the second conductive material 156. In some embodiments, the second conductive structure 158 may be substantially free of the conductive liner material 142 (e.g., titanium nitride, aluminum oxide).

In some embodiments, the first conductive material 154 may be formed by treating the sacrificial material 152 (FIG. 1I) with one or more chemical species facilitating the conversion of the sacrificial material 152 (e.g., silicon material, polysilicon material) into tungsten (e.g., β-phase tungsten, α-phase tungsten). By way of non-limiting example, if the sacrificial material 152 comprises polysilicon, the polysilicon may be treated with tungsten hexafluoride (WF$_6$) to form the first conductive material 154 at locations corresponding to the locations of the sacrificial material 152. Silicon (Si) of the sacrificial material 152 may react with the WF$_6$ to produce tungsten (W) and silicon tetrafluoride (SiF$_4$). The produced SiF$_4$ is removed as a gas. The produced tungsten remains in the first conductive material 154 neighboring the insulative structures 104 and the first conductive structures 140 comprising the conductive liner material 142 and the conductive material 144. In embodiments in which the sacrificial material 152 includes dopants, the dopants may remain in the first conductive material 154. In some embodiments, the sacrificial material 152 may, for example, be treated with WF$_6$ using a conventional CVD apparatus at a temperature within a range of from about 200° C. to about 500° C. Accordingly, the second conductive structures 158 comprising the first conductive material 154 and the second conductive material 156 may be formed directly on the vertically (e.g., in the Z-direction) sidewalls of the first conductive structures 140 and on laterally (e.g., in the X-direction, in the Y-direction) surfaces of the insulative structures 104.

In some embodiments, the first conductive material 154 comprises tungsten. In some embodiments, the first conductive material 154 comprises β-phase tungsten. β-phase tungsten has a metastable, A15 cubic structure. Grains of the β-phase tungsten may exhibit generally columnar shapes. Tungsten included within the first conductive material 154 may only be present in the β-phase, or may be present in the β-phase and in the alpha (α) phase. In some embodiments, the tungsten of the first conductive material 154 consists essentially of β-phase tungsten and is substantially free of α-phase tungsten. In some embodiments, the first conductive material 154 is substantially free of dopants. In some embodiments, at least some of the chlorine from the sacrificial material 152 (FIG. 1I) may remain in the first conductive material 154 in the form of, for example, a tungsten chloride.

If present in the first conductive material 154, the α-phase tungsten has a metastable, body-centered cubic structure. Grains of the α-phase tungsten may exhibit generally isometric shapes. If the first conductive material 154 includes β-phase tungsten and α-phase tungsten, an amount of β-phase tungsten included in the first conductive material 154 may be different than an amount of α-phase tungsten included in the first conductive material 154, or may be substantially the same as amount of α-phase tungsten included in the first conductive material 154. In some embodiments, an amount of β-phase tungsten included in the first conductive material 154 is greater than an amount of α-phase tungsten included in the first conductive material 154. For example, at least a majority (e.g., greater than 50 percent, such as greater than or equal to about 60 percent, greater than or equal to about 70 percent, greater than or equal to about 80 percent, greater than or equal to about 90 percent, greater than or equal to about 95 percent, or greater than or equal to about 99 percent) of the tungsten included in the first conductive material 154 may be present in the β-phase.

A thickness of the first conductive material 154 may correspond to the thickness T$_2$ (FIG. 1I) of the sacrificial material 152.

In some embodiments, the first conductive material 154 may contact the conductive liner material 142 and the conductive material 144 of the first conductive structures 140. In some such embodiments, the second conductive structures 158 may include α-phase tungsten and β-phase tungsten in contact with the first conductive structures 140.

The first conductive material 154 may be used as a seed material to form the second conductive material 156. In some embodiments, the second conductive material 156 is grown asymmetrically. In some such embodiments, a lateral dimension (e.g., in the X-direction, in the Y-direction, or both) of the second conductive material 156 may be grown faster than a vertical dimension (e.g., in the Z-direction).

In some embodiments, the second conductive material 156 may be grown from the first conductive material 154 by exposing the first conductive material 154 to precursors comprising tungsten hexafluoride (WF$_6$) and one or both of silane (SiH$_4$) and diborane (B$_2$H$_6$) to form the second conductive material 156. Accordingly, in some embodiments, the second conductive material 156 is formed with halogen-containing precursors. In some such embodiments, the second conductive material 156 may include at least some of the halogen (e.g., fluorine). In some embodiments, the second conductive material 156 includes fluorine (e.g., in the form of a tungsten fluoride) and is substantially free of chlorine.

The second conductive material 156 may comprise a different composition than the first conductive material 154. In some embodiments, the second conductive material 156 comprises α-phase tungsten and the first conductive material 154 comprises β-phase tungsten. In some embodiments, the second conductive material 156 is substantially free of β-phase tungsten. In some embodiments, the second conductive structures 158 may exhibit a step change in a phase of tungsten (e.g., from one of α-phase tungsten and β-phase tungsten to the other of α-phase tungsten and β-phase tungsten) at interfaces between the first conductive material 154 and the second conductive material 156. In some embodiments, the first conductive material 154 may exhibit a lower thermal conductivity than a thermal conductivity of the second conductive material 156. In some embodiments, the thermal conductivity of the first conductive material 154 may be within a range from about 1.69 W/m·K to about 2.41 W/m·K at about room temperature (about 20° C.), such as from about 1.69 W/m·K to about 1.80 W/m·K, from about 1.80 W/m·K to about 2.00 W/m·K, from about 2.00 W/m·K to about 2.20 W/m·K, or from about 2.20 W/m·K to about 2.41 W/m·K (at about room temperature. In some embodiments, the thermal conductivity of the second conductive material 156 may be within a range from about 170 W/m·K to about 180 W/m·K at about room temperature. Accordingly, in some embodiments, the thermal conductivity of the second conductive material 156 may be within a range of about 50 times to about 100 times the thermal conductivity of the first conductive material 154, such as from about 50 times to about 70 times, from about 70 times to about 90 times, or from about 90 times to about 100 times the thermal conductivity of the first conductive material 154 at room temperature.

Although FIG. 1J has been described and illustrated as comprising the second conductive structures 158 comprising distinct portions including the first conductive material 154 and the second conductive material 156, the disclosure is not so limited. In other embodiments, the second conductive structures 158 each exhibit a gradient composition in at least one direction, such as in the vertical (e.g., the Z-direction). In some embodiments, the second conductive structures 158 comprise a gradient of β-phase tungsten and α-phase tungsten in the vertical direction. By way of non-limiting example, the second conductive structures 158 may each exhibit a greater concentration of β-phase tungsten proximate the insulative structures 104 and the first conductive structure 140 than at other portions (e.g., vertically central portions, laterally central portions) thereof. In some embodiments, the concentration of β-phase tungsten in the second conductive structures 158 may increase with a decreasing distance from interfaces of the first conductive structure 140 and the second conductive structure 158. In some such embodiments, vertically central portions of the second conductive structure 158 may exhibit a lowest concentration (e.g., a negligible concentration) of the β-phase tungsten. In some embodiments, a concentration of α-phase tungsten may increase with an increasing distance from an interface of the second conductive structure 158 and each of the insulative structures 104 and the first conductive structure 140. In some such embodiments, a concentration of α-phase tungsten may be greatest at vertically central and laterally central portions of the second conductive structures 158.

In other embodiments, the second conductive structures 158 comprise the first conductive material 154 (and do not include the second conductive material 156) extending between the vertically (e.g., in the Z-direction) neighboring insulative structures 104. In some such embodiments, the second conductive structures 158 comprise or consist essentially of β-phase tungsten.

In some embodiments, the second conductive structures 158 comprise about 100 atomic percent β-phase tungsten at interfaces of the second conductive structures 158 and the insulative structures and are substantially free of α-phase tungsten at the interfaces. The concentration of the β-phase tungsten in the second conductive structures 158 may decrease (e.g., linearly, parabolically) with a distance from the interface and the concentration of α-phase tungsten may exhibit a corresponding increase with an increasing distance from the interface. At vertically central portions of the second conductive structures 158, the concentration of α-phase tungsten may be about 100 atomic percent and the second conductive structure 158 may be substantially free of β-phase tungsten at the vertically central portions.

In some embodiments, a grain size of the second conductive structures 158 (e.g., the first conductive material 154 and the second conductive material 156) may be larger than a grain size of the first conductive structures 140 (e.g., the conductive liner material 142 and the conductive material 144). In some embodiments, the first conductive material 154 and the second conductive material 156 may individually have a grain size within a range from about 61 nm to about 200 nm, such as from about 61 nm to about 80 nm, from about 80 nm to about 100 nm, from about 100 nm to about 120 nm, from about 120 nm to about 150 nm, or from about 150 nm to about 200 nm. In some embodiments, the grain size of the first conductive material 154 and the second conductive material 156 are individually greater than about 100 nm, such as greater than about 120 nm, or greater than 140 nm.

The grain size of the first conductive structures 140 (e.g., the conductive material 144) may be smaller than the grain size of the second conductive structures 158. The grain size of the first conductive structures 140 may be within a range from about 10 nm to about 60 nm, such as from about 10 nm to about 20 nm, from about 20 nm to about 40 nm, or from about 40 nm to about 60 nm. In some embodiments, the grain size of the first conductive structures 140 is less than about 60 nm, such as less than about 50 nm. In some embodiments, the grain size of the second conductive structures 158 is greater than two times the grain size of the first conductive structures 140. Without being bound by any particular theory, it is believed that the larger grain size of the second conductive structures 158 facilitates a reduction in a resistivity (and an increase in the conductivity) of the second conductive structures 158 relative to the first conductive structures 140. In some embodiments, the second conductive structures 158 exhibit a conductivity that is within a range from about 40% to about 80% greater than a conductivity of the first conductive structures 140, such as from about 40% to about 50%, from about 50% to about 60%, from about 60% to about 70%, or from about 70% to about 80% greater than the conductivity of the first conductive structures 140.

In some embodiments, a grain size of the first conductive material 154 and the second conductive material 156 may be substantially the same. In other embodiments, the grain size of the first conductive material 154 may be larger than the grain size of the second conductive material 156. In some embodiments, the second conductive structures 158 (e.g., the second conductive material 156) comprises α-phase tungsten having a larger grain size than a grain size of α-phase tungsten of the first conductive structure 140 (e.g., of the conductive liner material 142).

Formation of the second conductive structures 158 may form conductive levels 160 vertically neighboring the insulative structures 104 and vertically interposed between (vertically interleaved with) vertically neighboring insulative structures 104, the conductive levels 160 comprising the first conductive structures 140 and the second conductive structures 158 laterally neighboring the first conductive structures 140. In some embodiments, the conductive levels are located within vertical boundaries defined by vertically neighboring insulative structures 104. In some embodiments, an uppermost surface of the first conductive structure 140 of each conductive level 160 is substantially coplanar with an uppermost surface of the second conductive structure 158 of the same conductive level 160.

At least one lower conductive level 160 of the stack structure 148 may be employed as at least one lower select gate (e.g., at least one source side select gate (SGS)) of the microelectronic device structure 100. In some embodiments, a single (e.g., only one) conductive level 160 of a vertically lowermost tier 138 of the stack structure 148 is employed as a lower select gate (e.g., a SGS) of the microelectronic device structure 100. In addition, upper conductive level(s) 160 of the stack structure 148 may be employed as upper select gate(s) (e.g., drain side select gate(s) (SGDs)) of the microelectronic device structure 100. In some embodiments, horizontally-neighboring conductive levels 160 of a vertically uppermost tier 138 of the stack structure 148 (e.g., separated from each other by additional slot structures) are employed as upper select gates (e.g., SGDs) of the microelectronic device structure 100. In some embodiments, more than one (e.g., two, four, five, six) conductive levels 160 are employed as an upper select gate (e.g., a SGD) of the microelectronic device structure.

With continued reference to FIG. 1J, after forming the second conductive structures 158, the slots 136 (FIG. 1I) may be filled with one or more materials to form the slot structures 162. In some embodiments, the slot structures 162 include an insulative material 164. The insulative material 164 may include one or more of the materials described above with reference to the insulative structures 104. In some embodiments, the insulative material 164 comprises silicon dioxide. In other embodiments, the slot structures 162 include, for example, a liner material on sidewalls thereof and a conductive material horizontally neighboring the liner material. In some such embodiments, the liner material may comprise an insulative material, such as, for example, silicon dioxide; and the conductive material may include polysilicon or tungsten and may be in electrical communication with the source tier 110 (e.g., such as through the first source material 112).

Formation of the second conductive structures 158 comprising a larger grain size than the first conductive structures 140 may form the conductive levels 160 to exhibit an increased conductivity relative to conductive levels of conventional microelectronic device structures due to the relatively greater conductivity of the second conductive structures 158 relative to the first conductive structures 140. In addition, the first conductive structures 140 may remain laterally neighboring (e.g., around) the strings 170 of memory cells 172 to facilitate improved performance of the memory cells 172. For example, the conductive liner material 142 laterally neighboring the strings 170 of memory cells 172 may exhibit a work function facilitating improved performance of the memory cells 172. Thus, the conductive levels 160 may include first conductive structures 140 to facilitate improved performance of the memory cells 172 and second conductive structures 158 to facilitate improved conductivity of the conductive levels 160.

With reference to FIG. 1G, the second conductive structures 158 (FIG. 1J) may extend in a lateral direction (e.g., in the X-direction) along the length of the slot structures 162 (FIG. 1J). In some embodiments, a dimension of the second conductive structures 158 in a direction substantially parallel with the length of the slot structures 162 may be within a range from about 1 nm to about 1,000 nm, such as from about 1 nm to about 100 nm, from about 100 nm to about 200 nm, from about 200 nm to about 500 nm, or from about 500 nm to about 1,000 nm. In some embodiments, the lateral dimension of second conductive structures 158 is within a range from about 500 nm to about 1,000 nm. However, the disclosure is not so limited and the lateral dimension of the second conductive structures 158 may be greater than those described.

Figure 2:
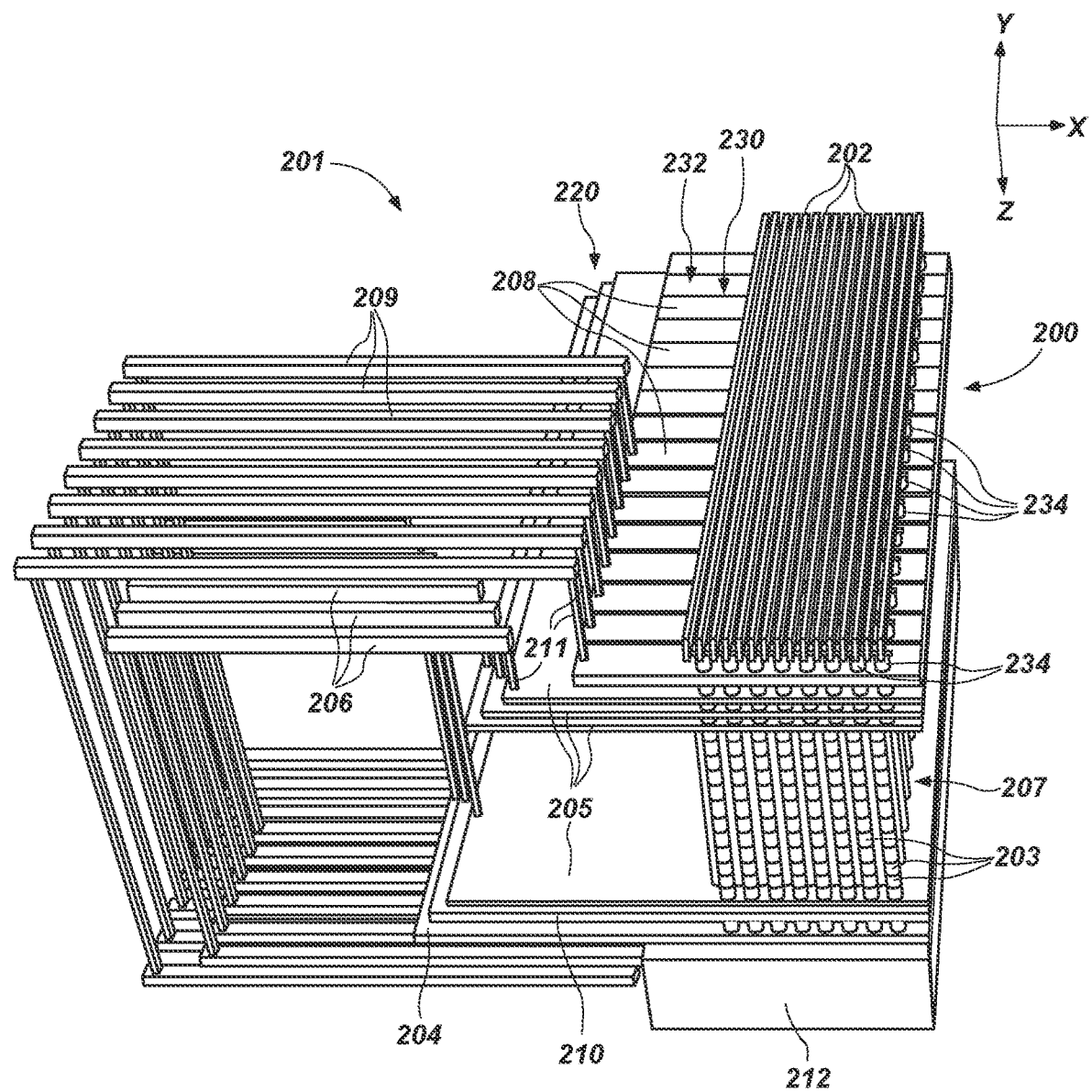
FIG. 2 is a partial cutaway perspective view of a microelectronic device, in accordance with embodiments of the disclosure.

FIG. 2 illustrates a partial cutaway perspective view of a portion of a microelectronic device 201 (e.g., a memory device, such as a dual-deck 3D NAND Flash memory device) including a microelectronic device structure 200. The microelectronic device structure 200 may be substantially similar to the microelectronic device structure 100 following the processing stages previously described with reference to FIG. 1J. As shown in FIG. 2, the microelectronic device structure 200 may include a staircase structure 220 defining contact regions for connecting access lines 206 to conductive tiers 205 (e.g., conductive layers, conductive plates, such as the conductive levels 160 (FIG. 1J) including the first conductive structures 140 (FIG. 1J) and the second conductive structures 158 (FIG. 1J)). The microelectronic device structure 200 may include vertical strings 207 (e.g., strings 170 (FIG. 1J)) of memory cells 203 (e.g., memory cells 172 (FIG. 1J)) that are coupled to each other in series. The vertical strings 207 may extend vertically (e.g., in the Z-direction) and orthogonally to conductive lines and tiers 205, such as data lines 202 (e.g., bit lines), a source tier 204 (e.g., the source tier 110 (FIG. 1J)), the conductive tiers 205, the access lines 206, first select gates 208 (e.g., upper select gates, drain select gates (SGDs), such as upper ones of the conductive levels 160), select lines 209, and a second select gate 210 (e.g., a lower select gate, a source select gate (SGS), such as lower ones of the conductive levels 160). The first select gates 208 may be horizontally divided (e.g., in the Y-direction) into multiple block structures 232 and sub-blocks horizontally separated (e.g., in the Y-direction) from one another by slot structures 230 (e.g., slot structures 162 (FIG. 1J)).

The data lines 202 may be electrically coupled to the vertical strings 207 through conductive contact structures 234 (e.g., conductive contact structures 135 (FIG. 1J)).

Vertical conductive contacts 211 may electrically couple components to each other as shown. For example, the select lines 209 may be electrically coupled to the first select gates 208 and the access lines 206 may be electrically coupled to the conductive tiers 205. The microelectronic device 201 may also include a control unit 212 positioned under the memory array, which may include control logic devices configured to control various operations of other features (e.g., the vertical strings 207 of memory cells 203) of the microelectronic device 201. By way of non-limiting example, the control unit 212 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control unit 212 may be electrically coupled to the data lines 202, the source tier 204, the access lines 206, the first select gates 208, and the second select gates 210, for example. In some embodiments, the control unit 212 includes CMOS (complementary metal-oxide-semiconductor) circuitry. In such embodiments, the control unit 212 may be characterized as having a "CMOS under Array" ("CuA") configuration.

The first select gates 208 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 202 (e.g., bit lines) may extend horizontally in a second direction (e.g., in the Y-direction) that is at an angle (e.g., perpendicular) to the first direction in which the first select gates 208 extend. The data lines 202 may be coupled to respective second groups of the vertical strings 207 at the first end (e.g., the upper end) of the vertical strings 207. A first group of vertical strings 207 coupled to a respective first select gate 208 may share a particular vertical string 207 with a second group of vertical strings 207 coupled to a respective data line 202. Thus, a particular vertical string 207 may be selected at an intersection of a particular first select gate 208 and a particular data line 202. Accordingly, the first select gates 208 may be used for selecting memory cells 203 of the vertical strings 207 of memory cells 203.

The conductive tiers 205 may extend in respective horizontal planes. The conductive tiers 205 may be stacked vertically, such that each conductive tier 205 is coupled to all of the vertical strings 207 of memory cells 203, and the vertical strings 207 of the memory cells 203 extend vertically through the stack of conductive tiers 205. The conductive tiers 205 may be coupled to or may form control gates of the memory cells 203 to which the conductive tiers 205 are coupled. Each conductive tier 205 may be coupled to one memory cell 203 of a particular vertical string 207 of memory cells 203.

The first select gates 208 and the second select gates 210 may operate to select a particular vertical string 207 of the memory cells 203 between a particular data line 202 and the source tier 204. Thus, a particular memory cell 203 may be selected and electrically coupled to a data line 202 by operation of (e.g., by selecting) the appropriate first select gate 208, second select gate 210, and conductive tier 205 that are coupled to the particular memory cell 203.

The staircase structure 220 may be configured to provide electrical connection between the access lines 206 and the conductive tiers 205 through the vertical conductive contacts 211. In other words, a particular level of the conductive tiers 205 may be selected via an access line 206 in electrical communication with a respective vertical conductive contact 211 in electrical communication with the particular conductive tier 205.

Thus, in accordance with some embodiments of the disclosure, a microelectronic device comprises a stack structure comprising insulative levels vertically interleaved with conductive levels. The conductive levels individually comprise a first conductive structure, and a second conductive structure laterally neighboring the first conductive structure, the second conductive structure exhibiting a concentration of β-phase tungsten varying with a vertical distance from a vertically neighboring insulative level. The microelectronic device further comprises slot structures vertically extending through the stack structure and dividing the stack structure into block structures, and strings of memory cells vertically extending through the stack structure, the first conductive structures between laterally neighboring strings of memory cells, the second conductive structures between the slot structures and strings of memory cells nearest the slot structures.

Furthermore, in accordance with further embodiments of the disclosure, a memory device comprises a stack structure comprising alternating conductive structures and insulative structures arranged in tiers, each of the tiers individually comprising a first conductive structure and an insulative structure, strings of memory cells vertically extending through the stack structure, the strings of memory cells comprising a channel material vertically extending through the stack structure, and a second conductive structure laterally neighboring the first conductive structure of each of the tiers, the second conductive structure comprising a non-uniform composition of α-phase tungsten and β-phase tungsten.

In accordance with additional embodiments, a method of forming a microelectronic device comprises forming pillars comprising a channel material in an array region of a stack structure comprising a vertically alternating sequence of insulative structures and additional insulative structures, forming slots vertically extending through the stack structure, removing the additional insulative structures through the slots, forming first conductive structures vertically between vertically neighboring insulative structures through the slots, removing portions of each of the first conductive structures, forming second conductive structures laterally neighboring remaining portions of the first conductive structures, the second conductive structures comprising a concentration of β-phase tungsten varying in a vertical direction, and filling the slots with an insulative material.

Figure 3:
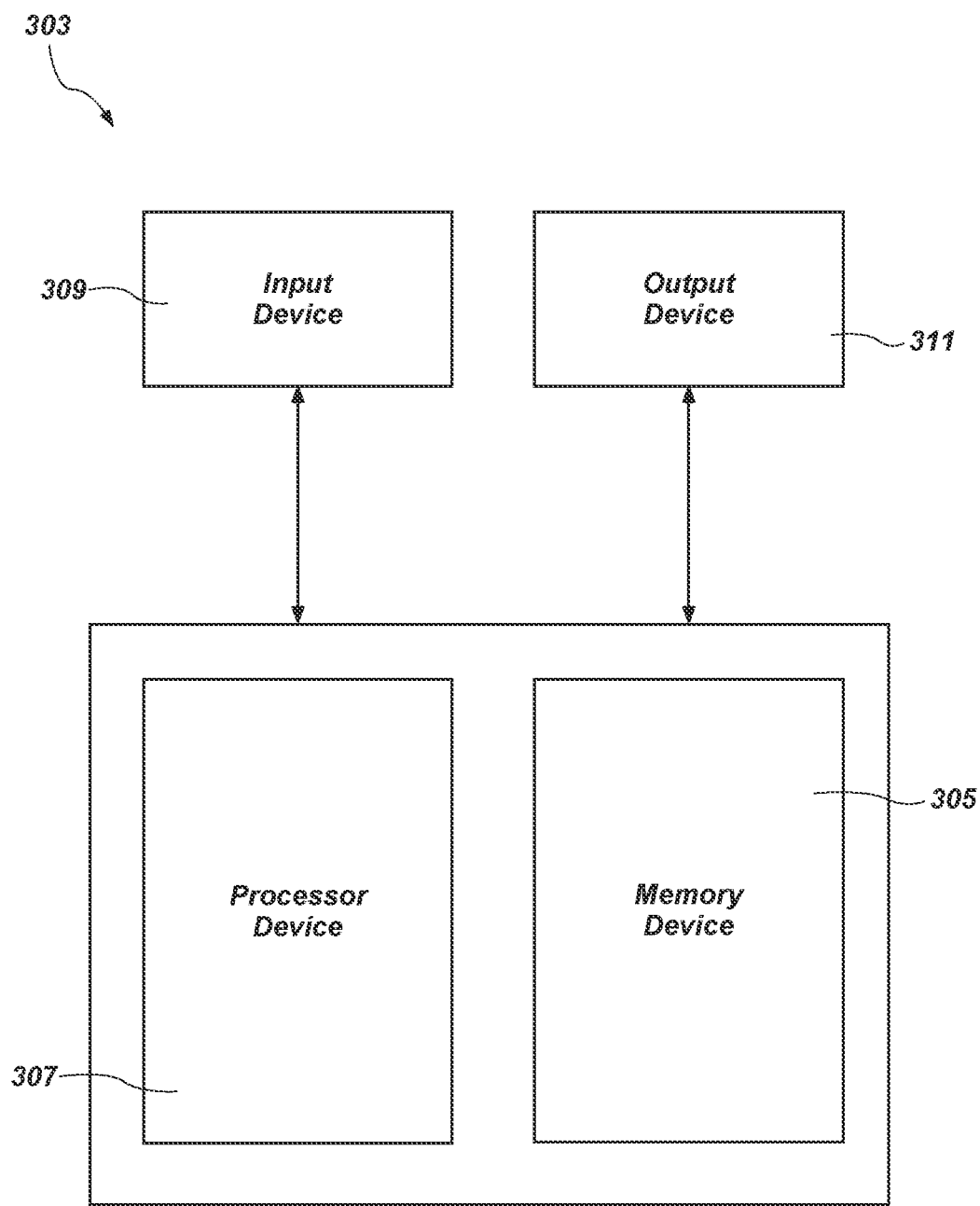
FIG. 3 is a block diagram of an electronic system, in accordance with embodiments of the disclosure.

Microelectronic devices (e.g., the microelectronic device 201 (FIG. 2)) and microelectronic device structures (e.g., the microelectronic device structures 100, 200) of the disclosure may be included in embodiments of electronic systems of the disclosure. For example, FIG. 3 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an IPAD® or SURFACE® tablet, an electronic book, a navigation device, etc. The electronic system 303 includes at least one memory device 305. The memory device 305 may include, for example, an embodiment one or more of a microelectronic device structure herein (e.g., the microelectronic device structure 100, 200) and a microelectronic device (e.g., the microelectronic device 201) previously described herein.

The electronic system 303 may further include at least one electronic signal processor device 307 (often referred to as a "microprocessor"). The electronic signal processor device 307 may, optionally, include an embodiment of one or more of a microelectronic device and a microelectronic device structure previously described herein. The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 4:
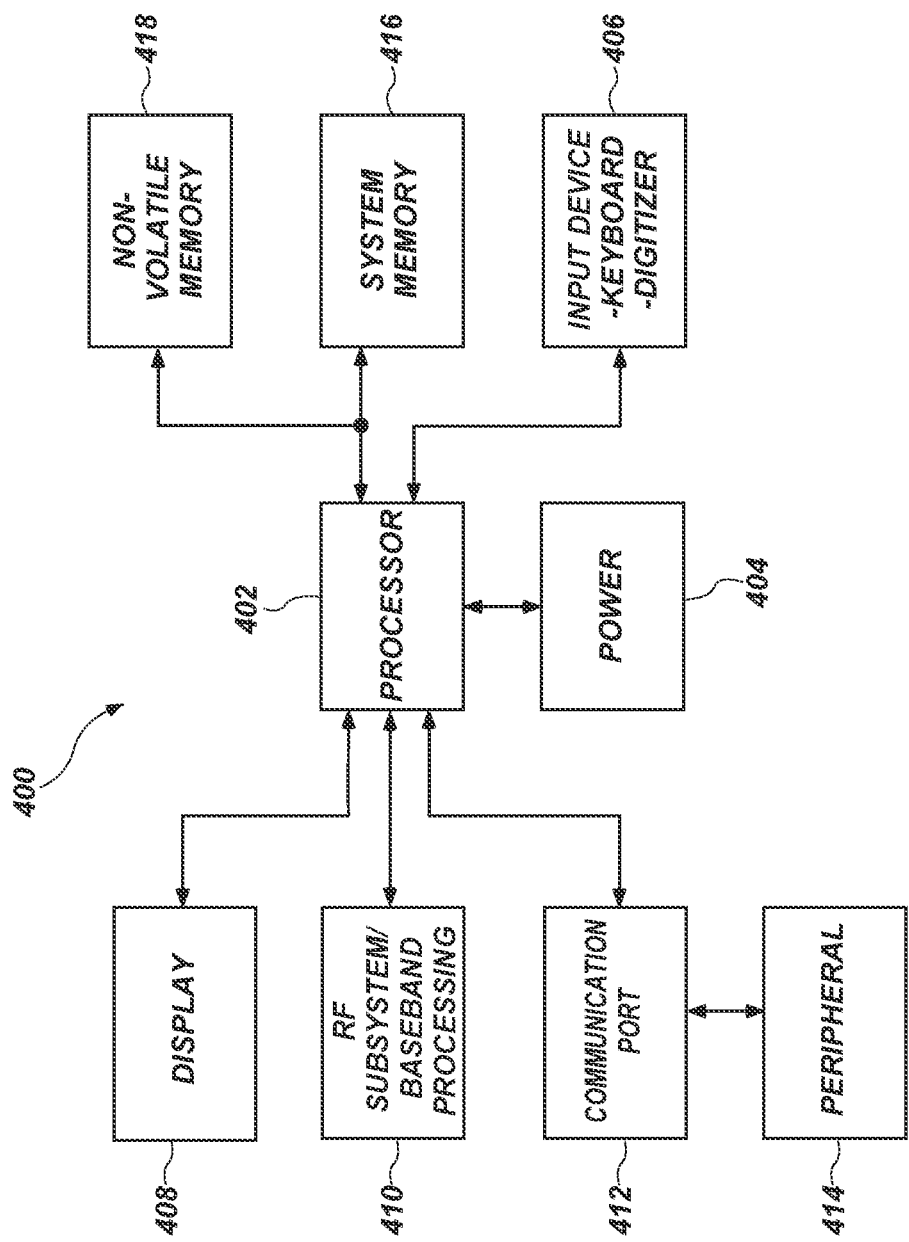
FIG. 4 is a block diagram of a processor-based system, in accordance with embodiments of the disclosure.

With reference to FIG. 4, depicted is a processor-based system 400. The processor-based system 400 may include one or more of a microelectronic device and a microelectronic device structure previously described herein and manufactured in accordance with embodiments of the disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include one or more of a microelectronic device and a microelectronic device structure previously described herein and manufactured in accordance with embodiments of the present disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as one or more of a microelectronic devices and a microelectronic device structure previously described herein.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include microelectronic devices, such as one or more of a microelectronic device and a microelectronic device structure previously described herein.

Accordingly, in at least some embodiments, an electronic device comprises an input device, an output device, a processor device operably coupled to the input device and the output device, and a memory device operably coupled to the processor device and comprising at least one microelectronic device structure. The at least one microelectronic device structure comprises strings of memory cells vertically extending through a stack structure comprising a vertically alternating sequence of insulative structures and first conductive structures, slot structures vertically extending through the stack structure and separating the stack structure into block structures, each block structure comprising some of the strings of memory cells, and second conductive structures laterally neighboring the first conductive structures and comprising a gradient of β-phase tungsten.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
    a stack structure comprising insulative levels vertically interleaved with conductive levels, the conductive levels individually comprising:
        a first conductive structure; and
        a second conductive structure laterally neighboring the first conductive structure, the second conductive structure exhibiting a concentration of β-phase tungsten varying with a vertical distance from a vertically neighboring insulative level;
    slot structures vertically extending through the stack structure and dividing the stack structure into block structures; and
    strings of memory cells vertically extending through the stack structure, the first conductive structures between laterally neighboring strings of memory cells, the second conductive structures between the slot structures and strings of memory cells nearest the slot structures.

2. The microelectronic device of claim 1, wherein the first conductive structure comprises α-phase tungsten.

3. The microelectronic device of claim 1, wherein the second conductive structure comprises:

a first conductive material in contact with vertically neighboring insulative levels and the first conductive structure; and a second conductive material in contact with the first conductive material.

4. The microelectronic device of claim 3, wherein:
the first conductive material comprises the β-phase tungsten; and
the second conductive material comprises α-phase tungsten.

5. The microelectronic device of claim 1, wherein the second conductive structure further comprises α-phase tungsten, the α-phase tungsten of the second conductive structure having a larger grain size than a grain size of the first conductive structure.

6. The microelectronic device of claim 1, wherein a grain size of the second conductive structure is greater than two times a grain size of the first conductive structure.

7. The microelectronic device of claim 1, wherein an uppermost surface of the first conductive structure of a level of the conductive levels is coplanar with an uppermost surface of the second conductive structure of the level of the conductive levels.

8. The microelectronic device of claim 1, wherein the second conductive structure comprises undoped β-phase tungsten.

9. The microelectronic device of claim 1, wherein the second conductive structure is substantially free of titanium nitride.

10. The microelectronic device of claim 1, wherein the second conductive structure is substantially free of titanium nitride and aluminum oxide.

11. A memory device, comprising:
a stack structure comprising alternating conductive structures and insulative structures arranged in tiers, each of the tiers individually comprising a first conductive structure and an insulative structure;
strings of memory cells vertically extending through the stack structure, the strings of memory cells comprising a channel material vertically extending through the stack structure; and
a second conductive structure laterally neighboring the first conductive structure of each of the tiers, the second conductive structure comprising a non-uniform composition of α-phase tungsten and β-phase tungsten.

12. The memory device of claim 11, wherein the first conductive structures comprise α-phase tungsten.

13. The memory device of claim 12, wherein the α-phase tungsten of the first conductive structures exhibits a smaller grain size than the α-phase tungsten of the second conductive structures.

14. The memory device of claim 11, wherein a grain size of the second conductive structures is larger than a grain size of the first conductive structures.

15. The memory device of claim 11, wherein the second conductive structures comprise a tungsten chloride.

16. The memory device of claim 11, wherein the first conductive structures are coplanar with the second conductive structures.

17. The memory device of claim 11, further comprising slot structures vertically extending through the stack structure.

18. The memory device of claim 17, wherein the second conductive structures extend from the slot structures to nearest ones of the strings of memory cells.

19. The memory device of claim 11, wherein the non-uniform composition of each second conductive structure varies with a vertical distance from a vertically neighboring insulative structure.

20. The memory device of claim 11, wherein each second conductive structure is located within vertical boundaries defined by vertically neighboring insulative structures.

21. The memory device of claim 11, wherein a lateral distance between a slot structure and a nearest string of memory cells is within a range from about 20 nm to about 40 nm.

22. A method of forming a microelectronic device, the method comprising:
forming pillars comprising a channel material in an array region of a stack structure comprising a vertically alternating sequence of insulative structures and additional insulative structures;
forming slots vertically extending through the stack structure;
removing the additional insulative structures through the slots;
forming first conductive structures vertically between vertically neighboring insulative structures through the slots;
removing portions of each of the first conductive structures;
forming second conductive structures laterally neighboring remaining portions of the first conductive structures, the second conductive structures comprising a concentration of β-phase tungsten varying in a vertical direction; and
filling the slots with an insulative material.

23. The method of claim 22, wherein forming the first conductive structures comprises forming first conductive structures comprising α-phase tungsten.

24. The method of claim 22, wherein forming the second conductive structures comprises forming second conductive structures comprising a maximum concentration of β-phase tungsten proximate the insulative structures.

25. The method of claim 22, wherein forming the second conductive structures comprises:
forming polysilicon laterally neighboring the remaining portions of the first conductive structures; and
exposing the polysilicon to tungsten hexafluoride to form the β-phase tungsten.

26. The method of claim 25, further comprising exposing the β-phase tungsten to additional tungsten hexafluoride and one or both of silane and diborane to form α-phase tungsten.

27. The method of claim 25, wherein forming polysilicon comprises forming the polysilicon with precursors comprising dichlorosilane and silane.

28. The method of claim 22, wherein forming the second conductive structures comprises forming second conductive structure having a grain size larger than a grain size of the first conductive structures.

29. The method of claim 22, wherein removing portions of each of the first conductive structures comprises removing titanium nitride and tungsten.

30. The method of claim 22, wherein removing portions of each of the first conductive structures comprises removing titanium nitride, aluminum oxide, and tungsten.

31. An electronic system, comprising:
an input device;
an output device;
a processor device operably coupled to the input device and the output device; and a memory device operably coupled to the processor device and comprising at least one microelectronic device structure, the at least one microelectronic device structure comprising:
- strings of memory cells vertically extending through a stack structure comprising a vertically alternating sequence of insulative structures and first conductive structures;
- slot structures vertically extending through the stack structure and separating the stack structure into block structures, each block structure comprising some of the strings of memory cells; and
- second conductive structures laterally neighboring the first conductive structures and comprising a gradient of β-phase tungsten.

32. The electronic system of claim 31, wherein the first conductive structures comprise a conductive liner material in contact with the insulative structures and a conductive material in contact with the conductive liner material.

33. The electronic system of claim 32, wherein the second conductive structures comprise α-phase tungsten and β-phase tungsten in contact with the conductive liner material.

34. The electronic system of claim 32, wherein the conductive liner material comprises a first material comprising aluminum oxide and a second material comprising titanium nitride.

35. The electronic system of claim 31, wherein a lateral dimension of each second conductive structure in a direction extending along a length of the slot structures is within a range from about 500 nm to about 1,000 nm.

* * * * *

UNITED STATES PATENT AND TRADEMARK OFFICE
CERTIFICATE OF CORRECTION

PATENT NO. : 11,594,495 B2  
APPLICATION NO. : 17/209993  
DATED : February 28, 2023  
INVENTOR(S) : Jordan D. Greenlee et al.

Page 1 of 1

It is certified that error appears in the above-identified patent and that said Letters Patent is hereby corrected as shown below:

In the Specification

Column 15,    Line 53,    change "alpha (a) phase" to --alpha (α) phase--

Signed and Sealed this  
Thirty-first Day of October, 2023

Katherine Kelly Vidal  
*Director of the United States Patent and Trademark Office*